(12) United States Patent
Komachi

(10) Patent No.: US 7,535,056 B2
(45) Date of Patent: May 19, 2009

(54) SEMICONDUCTOR DEVICE HAVING A LOW CONCENTRATION LAYER FORMED OUTSIDE A DRIFT LAYER

(75) Inventor: Tomonori Komachi, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 373 days.

(21) Appl. No.: 11/075,258

(22) Filed: Mar. 8, 2005

(65) Prior Publication Data
US 2005/0199905 A1   Sep. 15, 2005

(30) Foreign Application Priority Data
Mar. 11, 2004 (JP) ............... P.2004-068488
Aug. 31, 2004 (JP) ............... P.2004-251257

(51) Int. Cl.
*H01L 29/94* (2006.01)

(52) U.S. Cl. ............... 257/331; 257/335; 257/341; 257/339; 257/E29.256; 257/E29.261; 257/E21.418

(58) Field of Classification Search ............... None
See application file for complete search history.

(56) References Cited

U.S. PATENT DOCUMENTS

| | | | |
|---|---|---|---|
| 4,017,340 A | 4/1977 | Yerman | |
| 4,242,690 A | 12/1980 | Temple | |
| 5,882,986 A | 3/1999 | Eng et al. | |
| 6,184,555 B1 * | 2/2001 | Tihanyi et al. | 257/342 |
| 6,201,279 B1 | 3/2001 | Pfirsch | |
| 6,608,350 B2 | 8/2003 | Kinzer et al. | |
| 7,411,266 B2 * | 8/2008 | Tu et al. | 257/492 |
| 7,439,122 B2 * | 10/2008 | Shimizu | 438/218 |

FOREIGN PATENT DOCUMENTS

| | | |
|---|---|---|
| DE | 19922187 A1 | 11/2000 |
| DE | 10057612 A1 | 5/2002 |
| EP | 0 279 605 A2 | 8/1988 |
| JP | 2000-040822 | 2/2000 |
| JP | 2001-244461 | 9/2001 |
| JP | 2001-298190 | 10/2001 |
| JP | 2002-185018 A | 6/2002 |
| WO | 00/68997 A1 | 11/2000 |
| WO | 01/08226 A2 | 2/2001 |
| WO | 02/49114 A2 | 6/2002 |

OTHER PUBLICATIONS

Japanese Office Action dated Dec. 24, 2008.

* cited by examiner

Primary Examiner—Alonzo Chambliss
(74) Attorney, Agent, or Firm—Sughrue Mion, PLLC

(57) ABSTRACT

A semiconductor device includes a substrate, a first electrode and a second electrode formed on the substrate, and a drift layer which is formed between the first electrode and the second electrode, and becomes conduction in an ON state, and becomes depletion in an OFF state, a low concentration layer which is formed outside of the drift layer, and is opposite in polarity to that of the drift layer.

23 Claims, 12 Drawing Sheets

SEMICONDUCTOR DEVICE HAVING A LOW CONCENTRATION LAYER FORMED OUTSIDE A DRIFT LAYER

BACKGROUND OF THE INVENTION

1. Field of the Invention

The present invention relates to a semiconductor device applicable to an insulated gate type field effect transistor (MOSFET), a conductivity modulation type MOSFET (IGBT), a bipolar transistor, a diode, or the like, and a method of manufacturing the semiconductor device.

2. Description of the Related Art

More particularly, the invention relates to a DMOS for use in a semiconductor relay (SSR).

A conventional semiconductor device will be described by reference to FIGS. 1A, 1B, and 2. FIG. 1A is a longitudinal cross sectional diagram of a conventional vertical double-diffused MOS (vertical DMOS). Whereas, FIG. 1B is an electric field intensity distribution diagram at immediately before breakdown along the direction of thickness (longitudinal direction) within the device of FIG. 1A. Further, FIG. 2 is a layout diagram of the conventional example of FIG. 1A.

The conventional example of FIGS. 1A and 2 is composed of an n⁻ drift layer 1 formed of an n type silicon, a p base layer 2, a p⁺ layer 3, an n⁺ layer 4, an n⁺ layer 5, an oxide film layer 6, a gate electrode 7, a source electrode 8, a drain electrode 9, a guard ring 10, an oxide film layer 12, a field plate 13, a gate pad 14, and a source pad 15.

Thus, D denotes the thickness of the device, and W denotes the width of the device. Then, the direction of the thickness D of the n⁻ drift layer 1 is the longitudinal direction, and the direction of the width W of the device is the transverse direction. Incidentally, below, an element bearing a reference sign n in its name denotes the element using electrons as majority carriers, and an element bearing p denotes the element using holes as majority carriers. An element bearing a reference sign + denotes the element having a relatively high impurity concentration, and an element having a reference sign − denotes the element having a relatively low impurity concentration.

Further, on a first principal surface side of a substrate (on the top side of FIG. 1A), the source electrode 8 (the first electrode) is formed. Whereas, on a second principal surface side of the substrate (on the bottom side of FIG. 1A), the drain electrode 9 (the second electrode) is formed. Thus, the first principal surface is the side opposite to the second principal surface.

Further, the n⁻ drift layer 1 (drift layer) is connected to the source electrode 8 (first electrode) via the p base layer 2, the p⁺ layer 3, and the n⁺ layer 4. Whereas, the n⁻ drift layer 1 (drift layer) is connected to the drain electrode 9 (second electrode) via the n⁺ layer 5. Namely, the n⁻ drift layer 1 (drift layer) is formed between the source electrode 8 (first electrode) and the drain electrode 9 (second electrode).

Further, a terminal portion 11 of the device includes the guard ring 10 and the filed plate 13. Still further, as shown in the conventional example of FIGS. 1A and 2, the terminal portion 11 occupies a large area in the periphery of the device. Furthermore, when the breakdown voltage of the device is high, the area occupied by the terminal portion 11 is also large.

In such a conventional example of FIG. 1A, when the device is brought in the ON state according to the voltage of the gate electrode, the n⁻ drift layer 1 becomes conduction, so that an electric current passes from the drain toward the source. Namely, a current flows in a longitudinal direction with respect to the substrate.

Whereas, when the device is brought in the OFF state according to the voltage of the gate electrode, the n⁻ drift layer 1 is depleted due to the expansion of the depletion layer from the junction with the p base layer 2, so that the breakdown voltage is sustained. Whereas, when the voltage between the drain and the source increases, the depletion layer extends along the direction of the thickness D (the longitudinal direction) of the substrate.

Specifically, when the device is brought in the OFF state according to the voltage of the gate electrode 7, and the region between the drain electrode 9 and the source electrode 8 is brought in the reverse bias state, the n⁻ drift layer 1 is depleted due to the expansion of the depletion layer from the junction with the p base layer 2. As a result of this, the breakdown voltage of the device can be sustained.

Then, the electric field intensity of the n⁻ drift layer 1 becomes as shown in the electric field intensity distribution diagram of FIG. 1B at immediately before breakdown. The same diagram indicates that the electric field intensity becomes maximum at the junction site between the p base layer 2 and the n⁻ drift layer 1.

Whereas, with the conventional example of FIG. 1A, generally, the concentration of the n⁻ drift layer 1 is set so that the entire n⁻ drift layer is depleted in the OFF state for the breakdown voltage of the device.

Whereas, in the conventional example of FIG. 1A, for example, a breakdown voltage of 4300 V can be obtained at a concentration of the n⁻ drift layer 1 of about $3 \times 10^{13}/cm^3$ and a thickness D of 500 μm.

Incidentally, the value of the breakdown voltage of the device of the conventional example of FIG. 1A does not take the width W of the device as a parameter. Further, the value of the breakdown voltage of the device of the conventional example of FIG. 1A depends upon the concentration of the n⁻ drift layer 1 and the thickness D.

Further, when the device is brought in the OFF state according to the voltage of the gate electrode, the guard ring 10 and the field plate 13 arrange the lateral expansion of the depletion layer. Then, the depletion layer does not reach the side.

Specifically, when the device is brought in the OFF state according to the voltage of the gate electrode 7, and a reverse bias is applied between the drain electrode 9 and the source electrode 8, the guard ring 10 and the field plate 13 arrange the lateral expansion of the depletion layer.

Whereas, another conventional semiconductor device includes a multiple parallel pn structures joined alternately and repeatedly in a drift layer, a so-called superjunction structure (see, e.g., JP-A-2000-040822, JP-A-2001-298190, JP-A-2001-244461 and U.S. Pat. No. 6,608,350 (JP-A-2002-217415)).

In such a superjunction structure, the drift layer has a high impurity concentration, and the basic unit of the drift layer is formed with a narrow width.

Further, some semiconductor devices each include a plurality of vertical trenches separated from one another (see, e.g., U.S. Pat. No. 6,608,350 (JP-A-2002-217415)).

However, such a conventional example of FIG. 1A presents a problem of difficulty in reduction in size because of the necessity of a large area for the terminal portion 11. Further, it also presents a problem of a high ON resistance.

Particularly, when the breakdown voltage of the device is high, the area of the terminal portion 11 is large, resulting in a high ON resistance.

For example, the formation of the side of the n⁻ drift layer 1 by dicing results in inferior crystallinity, causing electric field concentration. This results in a reduction of the breakdown voltage. Therefore, a large area is required for the terminal portion 11.

Specifically, when the depletion layer reaches the side of the device, the electric field concentrates thereto, resulting in a reduction of the breakdown voltage. For this reason, the expansion of the depletion layer is restricted to the device surface, thereby to prevent the depletion layer from reaching the side of the device. To this end, a large area is required for the terminal portion 11 in the conventional example of FIG. 1A.

Further, the conventional semiconductor devices of JP-A-2000-040822 and JP-A-2001-298190, and the like have a problem of high cost because of the complicated multiple parallel pn structures.

Whereas, same conventional semiconductor devices may each have multiple parallel pn structures alternately and repeatedly joined in a drift layer, a so-called superjunction structure (see, e.g., U.S. Pat. No. 6,608,350 (JP-A-2002-217415)).

JP-A-2000-040822, JP-A-2001-298190, JP-A-2001-244461 and U.S. Pat. No. 6,608,350 (JP-A-2002-217415) are referred to as related art.

SUMMARY OF THE INVENTION

The object of the invention is to provide a simple, low-cost, small sized, low ON resistance, and high breakdown voltage semiconductor device, and a method of manufacturing the semiconductor device.

Another object of the invention is to provide a semiconductor device capable of inhibiting the effects of external electric charges, and a method of manufacturing the semiconductor device.

The other object of the invention is to provide a semiconductor device having a stable breakdown voltage characteristic, and a method of manufacturing the semiconductor device.

The other object of the invention is to provide a semiconductor device with a small leakage current, and a method of manufacturing the semiconductor device. More particularly, the object of the invention is to provide a semiconductor device with a small leakage current at a low voltage, and a high breakdown voltage, and a method of manufacturing the semiconductor device.

DETAILED DESCRIPTION OF THE PREFERRED EMBODIMENTS

Figure 1:
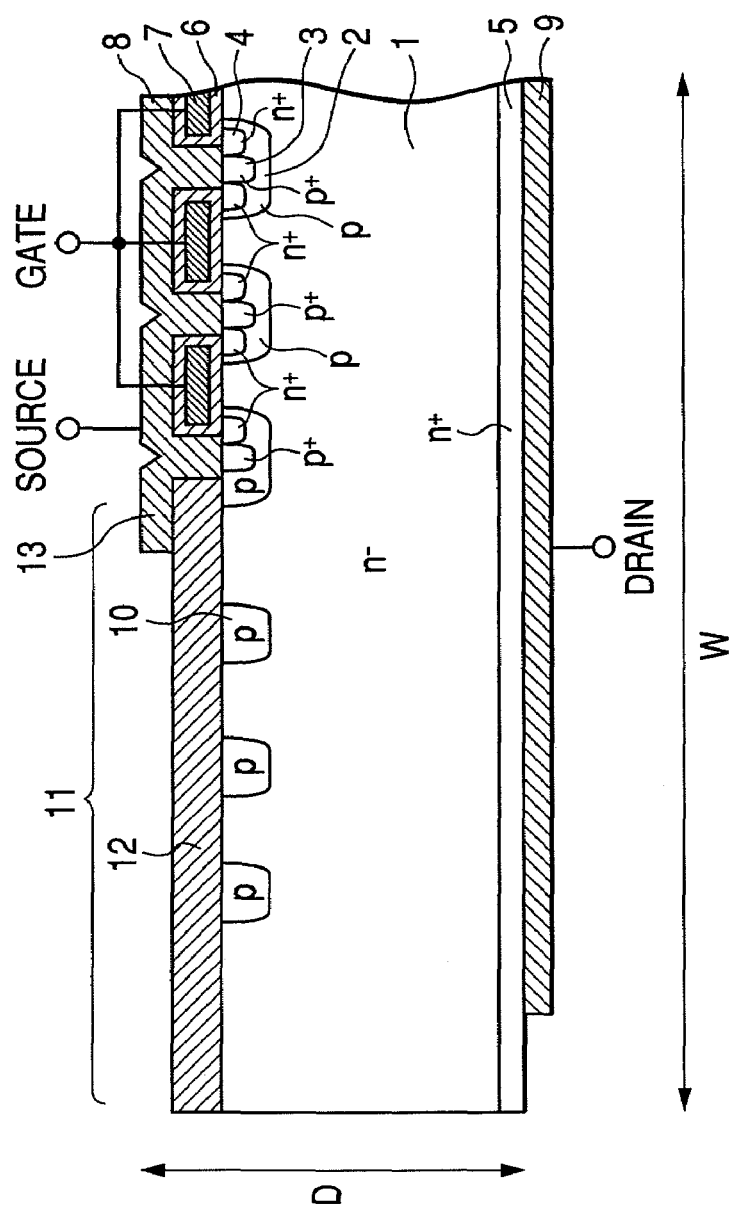
FIG. 1A is a longitudinal cross sectional diagram of a conventional vertical DMOS.
FIG. 1B is an electric field intensity distribution diagram at immediately before breakdown along the direction of thickness within the device of FIG. 1A.
Figure 2:
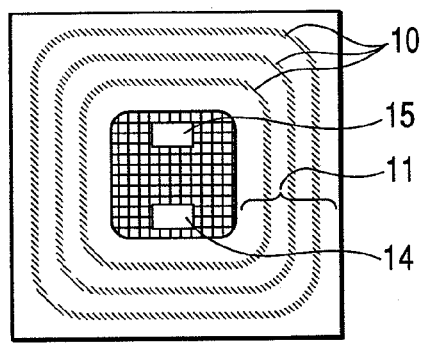
FIG. 2 is a layout diagram of the conventional example of FIG. 1A.
Figure 5A:
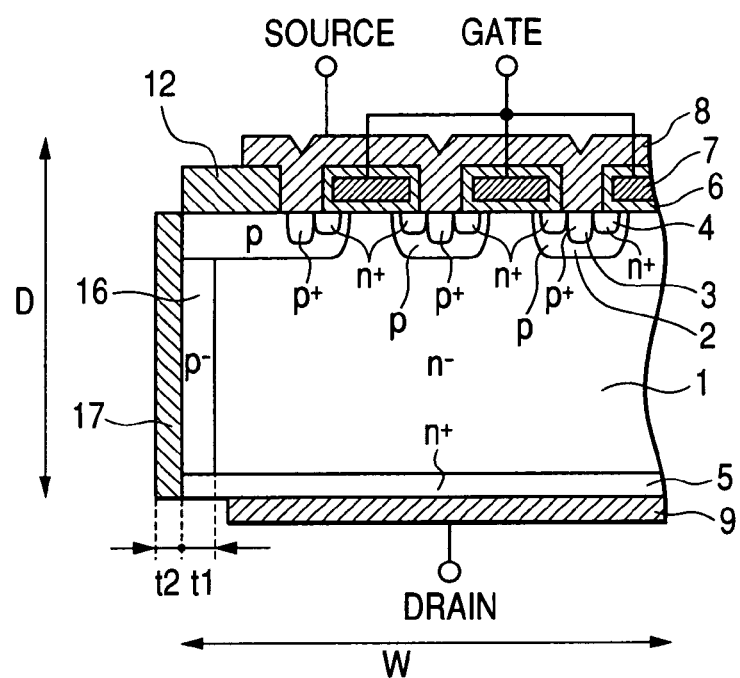
FIG. 5A is a longitudinal cross sectional diagram of a vertical DMOS showing one example of the present invention.
Figure 5B:
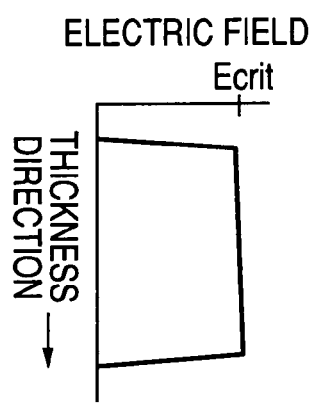
FIG. 5B is an electric field intensity distribution diagram at immediately before breakdown along the thickness direction within the device of FIG. 5A.

Below, the present invention will be described in details by reference to FIGS. 5A and 5B. FIG. 5A is a longitudinal cross sectional diagram of a vertical DMOS showing one example of the invention. Whereas, FIG. 5B is an electric field intensity distribution diagram at immediately before breakdown along the thickness direction (longitudinal direction) within the device of FIG. 5A. Incidentally, the same elements as those in the conventional example of FIG. 1A are given the same reference numerals and signs, and the description thereon is omitted.

The example of FIG. 5A is characterized by including a p⁻ layer 16 (low concentration layer).

Specifically, the p⁻ layer 16 is formed on the physical end of the side of an n⁻ drift layer 1 (drift layer). Namely, the p layer 16 is formed on the outermost side of the n⁻ drift layer 1 (drift layer).

Whereas, the p⁻ layer 16 is formed on the physical end of the side with respect to the direction (longitudinal direction) from a source electrode 8 (first electrode) toward a drain electrode 9 (second electrode). Namely, the p⁻ layer 16 is formed on the outermost side with respect to the direction (longitudinal direction) from the source electrode 8 (first electrode) toward the drain electrode 9 (second electrode).

Still further, the p⁻ layer 16 is formed to be of a p type which is the opposite conductivity type to that of the n⁻ drift layer 1 (drift layer). Namely, the p⁻ layer 16 and the n⁻ drift layer 1 (drift layer) are of the opposite polarities to each other.

Further, the p⁻ layer 16 and the n⁻ drift layer 1 (drift layer) are joined in a less defective state. Further, the p⁻ layer 16 is depleted when the device is brought in the OFF state according to the voltage of the gate electrode.

Whereas, the device includes an oxide film layer 17 (insulating material) on the outside of the p⁻ layer 16 (low concentration layer). The oxide film layer 17 is preferable because it can protect the p⁻ layer 16.

Further, the example of FIG. 5A has the thickness t1 of the p⁻ layer 16 and the thickness t2 of the oxide film layer 17.

Figure 6:
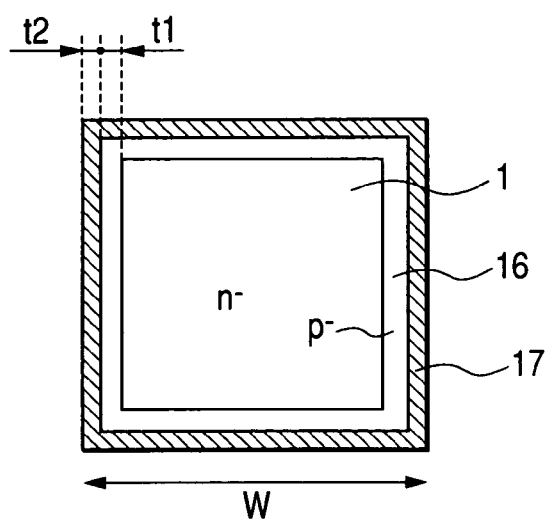
FIG. 6 is a transverse cross sectional diagram in one layout example of the example of FIG. 5A.

Whereas, FIG. 6 is a transverse cross sectional diagram in one layout example of the example of FIG. 5A. Incidentally, the same elements as those in FIG. 5A are given the same reference numerals and signs, and the description thereon is omitted. Then, in FIGS. 5A and 6, the p⁻ layer 16 and the oxide film layer 17 are exaggerated.

In FIG. 6, the p⁻ layer 16 is formed so as to surround the n⁻ drift layer 1. Further, the oxide film layer 17 is formed so as to surround the p⁻ layer 16.

Namely, the p⁻ layer 16 forms a continuous non-isolated structure. Similarly, the oxide film layer 17 forms a continuous non-isolated structure.

In such an example of FIG. 5A, when the device is brought in the ON state according to the voltage of the gate electrode, as with the conventional example of FIG. 1A, the n⁻ drift layer 1 becomes conduction, so that a current flows in the direction from the drain toward the source.

Whereas, when the device is brought in the OFF state according to the voltage of the gate electrode, in the n⁻ drift layer 1, the depletion layer expands from the junction with the p base layer 2 and the p⁻ layer 16. Then, the depleted region expands in both the directions of the longitudinal direction (the thickness direction within the device) and the transverse direction (the direction of the width W of the device).

Specifically, when the device is brought in the OFF state according to the voltage of the gate electrode 7, and a reverse bias is applied between the drain electrode 9 and the source electrode 8, in the n⁻ drift layer 1, the depletion layer expands from the junction with the p base layer 2 and the p⁻ layer 16.

Figure 3:
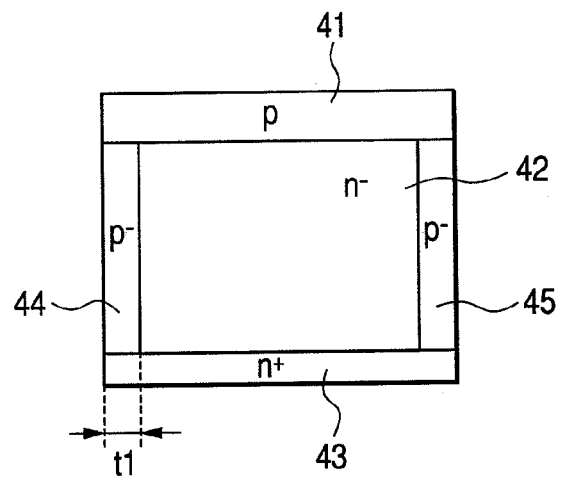
FIG. 3 is a longitudinal cross sectional diagram showing a basic unit of a diode part in a semiconductor device of the present invention.

FIG. 3 is a longitudinal cross sectional diagram of a selected configuration involved in sustaining the breakdown voltage in such a semiconductor device. Namely, FIG. 3 is a longitudinal cross sectional diagram showing the basic unit of the diode part in the semiconductor device. Whereas, in the same diagram, the FET part is not shown. Further, in the same diagram, the dimension of each element is shown on an enhanced scale.

Thus, the longitudinal direction of the same diagram is the direction of thickness of the device, and the transverse direction of the same diagram is the direction of width of the device. Incidentally, below, an element bearing a reference sign n in its name denotes the element using electrons as majority carriers, and an element bearing p denotes the element using holes as majority carriers. An element bearing a reference sign + denotes the element having a relatively high impurity concentration, and an element bearing a reference sign − denotes the element having a relatively low impurity concentration.

The example of FIG. 3 forms a vertical double-diffused MOS (vertical DMOS). Further, the top side of the same diagram is the first principal surface side of a substrate, and a first electrode (not shown) is formed thereon. The first electrode is connected to a base layer 41. Then, the base layer 41 is formed to be of a p type.

Further, the bottom side of the same diagram is the second principal surface side of the substrate, and a second electrode (not shown) is formed thereon. The second electrode is connected to an n⁺ layer 43.

Whereas, a drift layer 42 is formed between the base layer 41 (first electrode) and the n⁺ layer 43 (second electrode). Further, the drift layer 42 is formed to be of an n⁻ type. Thus, the drift layer 42 becomes conduction in the ON state, and becomes depleted in the OFF state.

Further, a side p layer 44 and a side p layer 45 which are low concentration layers are formed on the sides of the drift layer 42. Further, the side p layer 44 and the side p layer 45 are formed to be of a p⁻ type which is the opposite conductive type to that of the drift layer 42. Incidentally, the concentration and the thickness t1 of the side p layer 44 and the side p layer 45 are set in consideration of the concentration and the width of the drift layer 42, and other factors. Whereas, the concentration of the drift layer 42 is set based on the breakdown voltage and the ON resistance of the device.

Figure 4A:
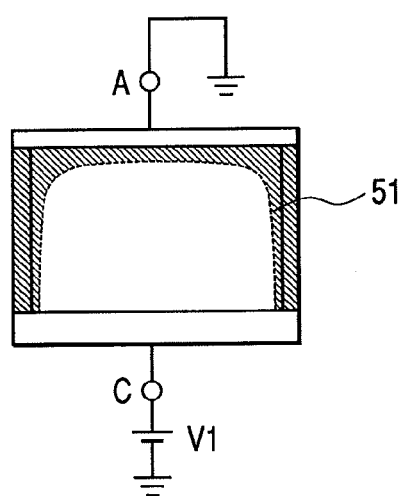
FIGS. 4A and 4B are cross sectional diagrams each showing the distribution of a depletion layer for reverse bias in the example of FIG. 3.
Figure 4B:
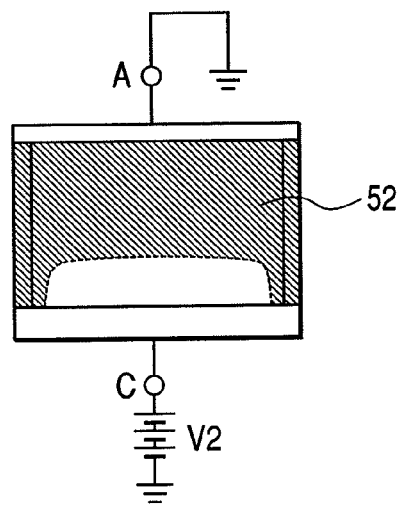

The operation of such an example of FIG. 3 will be described by reference to FIGS. 4A and 4B. FIGS. 4A and 4B each are a longitudinal cross sectional diagram showing the distribution of the depletion layer for the reverse bias (reverse voltage application) in the example of FIG. 3. FIG. 4A shows the distribution of a depletion layer 51 when a low voltage V1 is applied between a first electrode A and a second electrode C. FIG. 4B shows the distribution of a depletion layer 52 when a high voltage V2 is applied between an anode A which is the first electrode and a cathode C which is the second electrode.

The depletion layers 51 and 52 are generated in such a manner as to expand from the junction plane between the base layer 41, the side p layer 44, and the side p layer 45, and the drift layer 42 and the n⁺ layer 43. Incidentally, the side p layer 44 and the side p layer 45 prevent the curvature of the depletion layers 51 and 52 at the side from being reduced, so that the concentration of an electric field is avoided. For this reason, the example of FIGS. 4A and 4B can implement the characteristics of a high breakdown voltage.

However, the example of FIG. 3 presents a problem of a large leakage current.

In the example of FIG. 3, the leakage current for the reverse bias (reverse voltage application) is predominantly a produced current by the production of pairs of electrons and holes in the depletion layers 51 and 52. As a result, the leakage current depends upon the volumes of the depletion layers 51 and 52. Specifically, the larger the volume of the depletion layer is, the larger the leakage current becomes.

Then, particularly, the example of FIG. 3 has the following problem: the expansion of the depletion layer 51 when a low voltage V1 has been applied is large, resulting in a large leakage current. Incidentally, the leakage current is also large when the side shows a poor crystalline state due to defects or the like.

First, a description will be given to the case where the width W of the device of the semiconductor device is set to be equal to, or smaller than the width based on the concentration of the n⁻ drift layer in the example of FIG. 5A.

In this case, when the device is brought in the OFF state according to the voltage of the gate electrode, the depleted region expands in the transverse direction (the direction of the width W of the device) at a burst.

Then, the electric field of the n⁻ drift layer 1 becomes as shown in the electric field intensity distribution diagram of FIG. 5B at immediately before breakdown. As shown in the same diagram, the electric filed intensity becomes roughly uniform within the device, resulting in the characteristic of a high breakdown voltage.

For example, in the example of FIG. 5B, when the concentration of the n⁻ drift layer 1 is about $3\times10^{13}/cm^3$, the thickness D is 500 μm, and the width W of the device is 200 μm, a breakdown voltage of 7500 V or more can be obtained.

Therefore, the example of FIG. 5A provides a higher breakdown voltage than that of the conventional example of FIG. 1A. Whereas, the value of the breakdown voltage of the device of the example of FIG. 5A takes the width W of the device as a parameter as distinct from the case of the conventional example of FIG. 1A.

Figure 7:
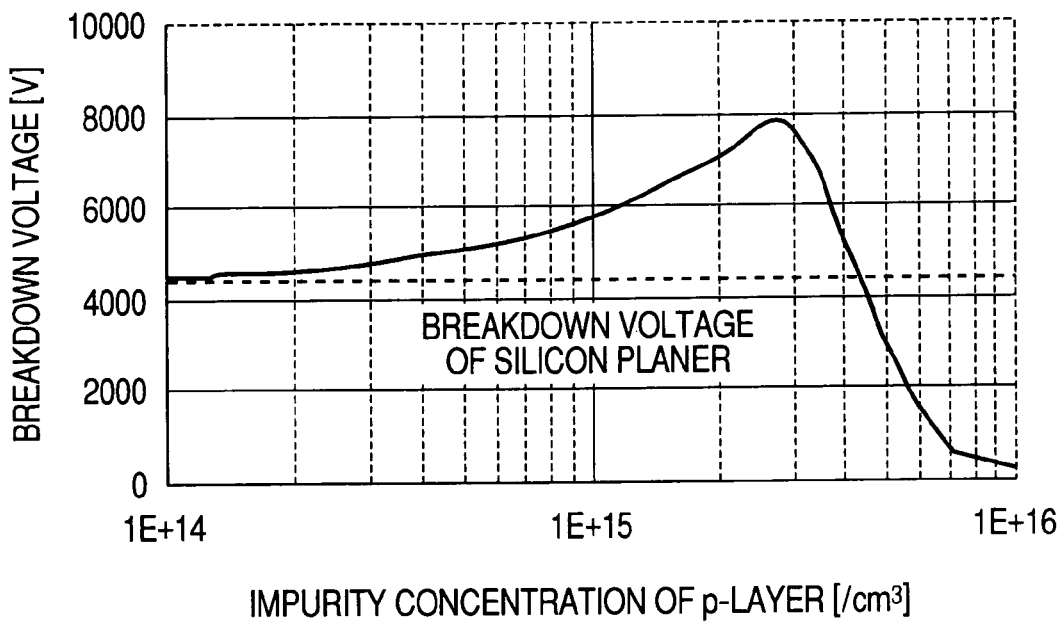
FIG. 7 is a characteristic diagram showing the characteristics of the breakdown voltage versus the concentration of a p⁻ layer 16 in the example of FIG. 5A.

Further, the breakdown voltage of the example of FIG. 5A will be described by reference to FIG. 7. FIG. 7 is a characteristic diagram showing the characteristics of the breakdown voltage versus the concentration of the p⁻ layer 16 in the example of FIG. 5A.

However, the diagram shows the characteristic that the thickness t1 of the p⁻ layer 16 is 1 μm.

Such a characteristic diagram of FIG. 7 shows the characteristic that a change in concentration of the p⁻ layer 16 results in the breakdown voltage having a peak (about 7500V). Then, the peak becomes larger than the planar breakdown voltage (about 4300 V).

Therefore, the concentration of the p⁻ layer 16 is preferably set to be on the order of a value resulting in the peak of the breakdown voltage. An increase in breakdown voltage of the device enables the reduction of thickness D of the device. Accordingly, it becomes easy to reduce the ON resistance.

Incidentally, such a characteristic of the breakdown voltage is the effect typical of the case where the width W of the semiconductor device is set to be equal to, or smaller than the width based on the concentration of the n⁻ drift layer 1. Therefore, when the breakdown voltage of the device is designed in consideration of the width W of the semiconductor device and the concentration of the p⁻ layer 16, it is possible to provide a further preferable semiconductor device.

For example, when the breakdown voltage of the device is set at 4300V in the example of FIG. 5A, it is possible to set the thickness D of the n⁻ drift layer 1 at about 270 μm.

Therefore, at a breakdown voltage of 4300 V of the device, the thickness D (270 μm) of the device of the example of FIG. 5A is smaller than the thickness D (500 μm) of the device of the example of FIG. 1A. Namely, the example of FIG. 5A can be made smaller in size than the conventional example of FIG. 1A.

Further, the guard ring, the field plate, and the like at the terminal portion of the device becomes unnecessary. This enables the reduction in size and the reduction in cost.

Whereas, in the example of FIG. 5A, when the breakdown voltage of the device is 4300V, the thickness D of the n⁻ drift layer 1 is 270 μm, the width W of the device is about 20 μm, the thickness t1 of the p⁻ layer 16 is about 1 μm, and the concentration of the p⁻ layer 16 is about $1.1\times10^{16}/cm^3$, it is possible to set the concentration of the n⁻ drift layer 1 at about $2\times10^{15}/cm^3$.

For such an example of FIG. 5A, the p⁻ layer 16 (low concentration layer) has a concentration such that the entire n⁻ drift layer 1 (drift layer) and the entire p⁻ layer 16 (low concentration layer) are depleted in the OFF state at a voltage lower than the breakdown voltage of the device of the semiconductor device.

Namely, for the example of FIG. 5A, the p layer 16 (low concentration layer) has a concentration such that the entire n⁻ drift layer 1 (drift layer) and the entire p⁻ layer 16 (low concentration layer) are depleted in the reverse bias state at a voltage sufficiently lower than the breakdown voltage of the device of the semiconductor device.

Such formation can reduce the ON resistance of the device. Specifically, the ratio of the specific resistance of the n⁻ drift layer 1 of the example of FIG. 5A and the specific resistance of the n⁻ drift layer 1 of the conventional example of FIG. 1A is approximately 1:64.

Therefore, the example of FIG. 5A has a lower ON resistance than that of the conventional example of FIG. 1A, and hence it is possible to increase the current density. Further, it becomes easy to reduce the size and the cost.

Whereas, when the p⁻ layer 16 is sufficiently narrower as compared with the n⁻ drift layer 1, the concentration of the p⁻ layer 16 is set higher than the concentration of the n⁻ drift layer 1. As a result, the breakdown voltage of the device layer 1 becomes high, resulting in a preferable characteristic.

For example, when the thickness t1 of the p⁻ layer 16 is about 1/10 of the width of the n⁻ drift layer 1, the concentration of the p⁻ layer 16 is set at about five times the concentration of the n⁻ drift layer 1, resulting in a preferred characteristic.

Then, keeping a balance between the electric charges in the p⁻ layer 16 and the electric charges in the n⁻ drift layer 1 can provide a preferable characteristic.

Secondly, a description will be given to the case where the p⁻ layer 16 (low concentration layer) has the concentration based on the electric charges of the oxide film layer 17 on the outside of the p⁻ layer 16, the protective material, and the sealing material in the example of FIG. 5A.

In this case, the amount of electric charges of the oxide film layer 17 on the outside of the p⁻ layer 16, the protective material, the sealing material, and the like is previously predicted. Then, electric charges are injected in an amount compensating for the predicted electric charge amount into the p⁻ layer 16. Namely, the concentration of the p⁻ layer 16 is controlled.

Figure 8:
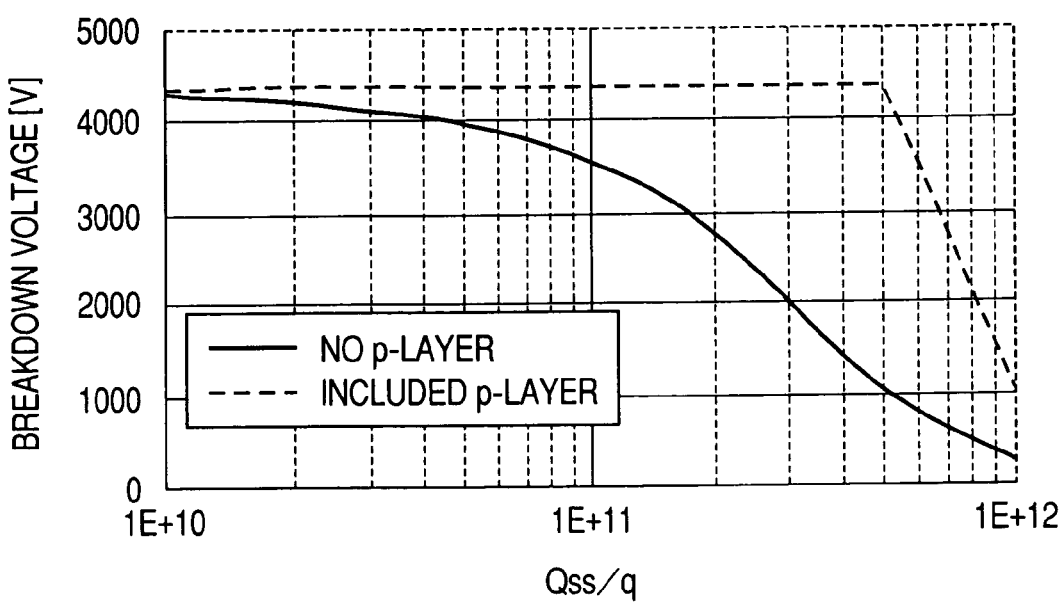
FIG. 8 is a characteristic diagram showing the characteristics of the breakdown voltage versus the electric charge Qss in the example of FIG. 5A.

Herein, the effects of the oxide film layer 17 on the outside of the p⁻ layer 16 will be described by reference to FIG. 8. FIG. 8 is a characteristic diagram showing the characteristics of the breakdown voltage versus the electric charge Qss in the example of FIG. 5A. Incidentally, the electric charge Qss is the electric charge in the oxide film layer 17.

In the characteristic diagram of FIG. 8, the characteristic of the solid line of no p⁻ layer is the characteristic of the case where the p⁻ layer has been deleted in the example of FIG. 5A. Whereas, in the characteristic diagram of FIG. 8, the characteristic of the broken line of the included p⁻ layer is the characteristic of the example of FIG. 5A.

As shown in the same diagram, the characteristic of no p⁻ layer is such that an increase in electric charge Qss results in a sharp reduction of the breakdown voltage. This is for the following reason: the side of the n⁻ drift layer 1 becomes a dense n type layer due to the electric charge Qss. As a result, the expansion of the depletion layer is inhibited, so that the electric field is concentrated.

Whereas, in the characteristic diagram of FIG. 8, the characteristic of the included p⁻ layer (example of FIG. 5A) is such that a stable breakdown voltage can be obtained even when the electric charge Qss changes. This is because the vicinity of the p⁻ layer 16 is depleted when the device is brought in the OFF state.

Specifically, when the device is brought in the OFF state according to the voltage of the gate electrode 7, and a reverse bias is applied between the drain electrode 9 and the source electrode 8, the vicinity of the p⁻ layer 16 is depleted.

Therefore, the example of FIG. 5A can inhibit the effects of the external electric charges (the oxide film layer 17, the protective material, the sealing material, and the like). Thus, the stability of the breakdown voltage of the device in the example of FIG. 5A is improved.

For example, when the initial breakdown voltage of the device is set to be the median value, it is possible to provide a semiconductor device stable to any of the external plus electric charges or the external minus electric charges.

Whereas, when the long-term drift of the breakdown voltage of the device receives the effects of the plus electric charges, the concentration of the p⁻ layer 16 is previously designed so that the device is stable to the plus electric charges. As a result, it is possible to provide a preferable semiconductor device.

On the other hand, in the examples of FIGS. 5A and 6, the breakdown voltage of the device when the width W of the device is sufficiently large is roughly determined by the concentration of the n⁻ drift layer 1 and the thickness D of the n⁻ drift layer 1 as with the breakdown voltage of the device in the conventional example of FIG. 1A.

Therefore, in the examples of FIGS. 5A and 6, the value of the breakdown voltage of the device when the width W of the device is sufficiently wide does not take the width W of the device as a parameter. Incidentally, in the example of FIG. 5A, the value of the breakdown voltage of the device when the width W of the device is small takes the width W of the device as a parameter.

Further, in the examples of FIGS. 5A and 6, the concentration of the p⁻ layer 16 is formed so that the voltage at which the entire n⁻ drift layer 1 and the entire p⁻ layer 16 are depleted is lower than the breakdown voltage of the device. As a result, it is possible to obtain a semiconductor device with stable characteristics.

As shown in the foregoing description, also for the structure in which the width W of the device of the semiconductor device is formed large to such an extent that the breakdown voltage of the device is roughly determined by the concentration of the n⁻ drift layer 1 and the thickness D of the n⁻ drift layer 1, the effects of the external electric charges are inhibited by the action of the p⁻ layer 16 in the same manner as described above. As a result, the example of FIG. 5A provides a semiconductor device with a stable breakdown voltage.

Thirdly, a description will be given to the layout of the case where the width W of the semiconductor device is set to be equal to, or smaller than the width based on the concentration of the n⁻ drift layer 1 by reference to FIGS. 9A to 9D. FIGS. 9A to 9D are perspective views showing other layout examples of the example of FIG. 5A.

The examples of FIGS. 9A to 9D are each characterized in that the drain electrode (not shown) which is a second electrode is shared in common, and that a plurality of drift layers are formed in parallel to one another.

Such parallel arrangement can reduce the ON resistance. Further, it can increase the electric current capacity.

Then, the p⁻ layer 16 and the oxide film layer 17 of each example of FIGS. 9A to 9D form a continuously meandering non-separated structure.

Further, each example of FIGS. 9A to 9D is a structure in one chip. Still further, each example of FIGS. 9A to 9D is formed such that not only the drain electrode but also the n⁺ layer 5 are shared in common. Whereas, the direction of length and the direction of width in the substrate are taken as the X direction and the Y direction, respectively.

Figure 9A:
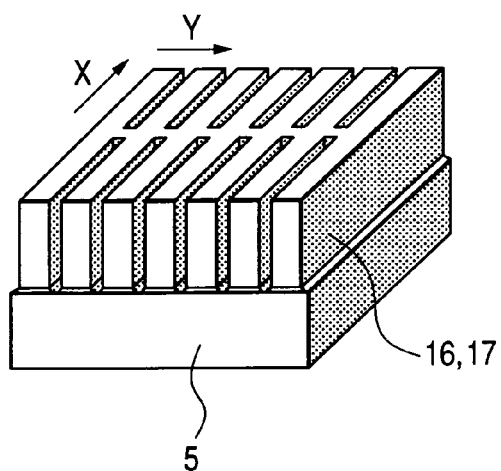
FIGS. 9A to 9D are perspective diagrams showing other layout examples of the example of FIG. 5A.

Further, FIG. 9A shows a layout in which branching occurs at the central part of the substrate to form the n⁻ drift layer in the shape of a combination of H shapes (U shapes).

Figure 9B:
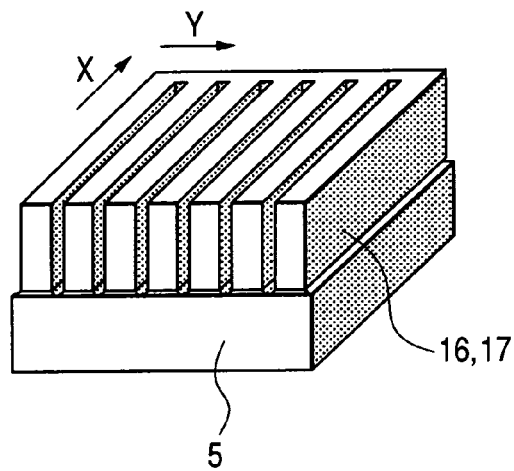

Still further, FIG. 9B shows a layout in which branching occurs at the edge of the substrate to form the n⁻ drift layer in the shape of a combination of E shapes (U shapes).

Figure 9C:
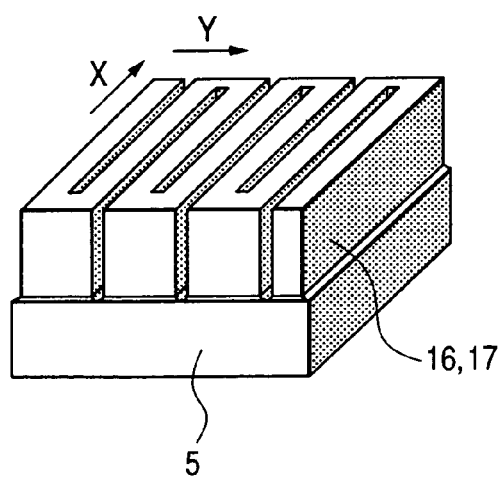

Moreover, FIG. 9C is a layout in which no branching occurs to form the n⁻ drift layer in the continuous fanfold form.

Figure 9D:
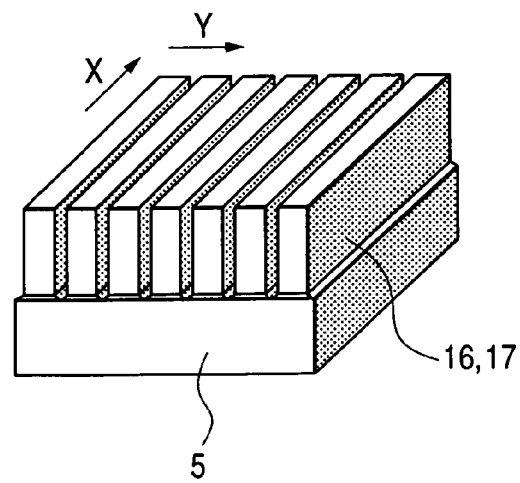

Whereas, FIG. 9D is a layout in which the layer is divided into a plurality of parts to form the n⁻ drift layer in short strips. Then, an electrode is added on the top face of each protrusion, and a connection is established between the electrodes by wire bonding or the like during assembly, resulting a parallel arrangement.

Figure 10A:
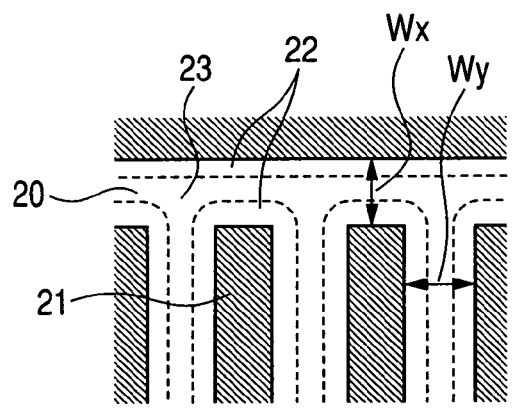
FIGS. 10A to 10D are enlarged diagrams of the layout diagrams of FIGS. 9A to 9D.
Figure 10B:
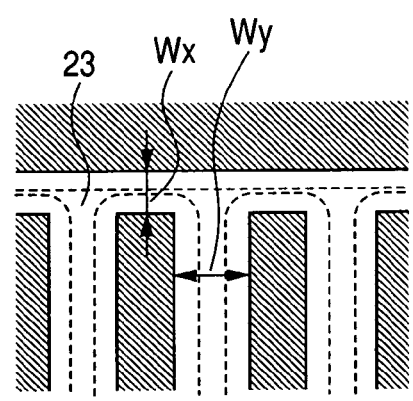
Figure 10C:
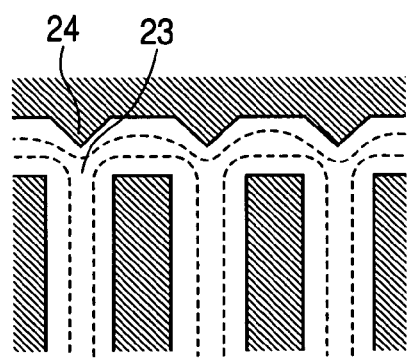

Furthermore, each layout of FIGS. 9A to 9D will be described in details by reference to FIGS. 10A to 10D. FIGS. 10A to 10C are each an enlarged view of the vicinity of the intersection of the device formed along the X direction and the device formed along the Y direction in each layout diagram of FIGS. 9A to 9D. Whereas, FIG. 9D is an enlarged view of the vicinity of the intersection of the device formed along the X direction and the device formed along the X direction in each layout diagram of FIGS. 9A to 9D.

In FIGS. 10A to 10D, a reference numeral 20 denotes a device portion; 21, an isolation trench; 22, a depletion layer; 23, an intersection of the device portion 20 formed along the Y direction and the device portion 20 formed along the X direction; and 24, a slit. Further, Wx denotes the width of the device portion 20 formed along the direction of length (X direction) of the substrate, and Wy denotes the width of the device portion 20 formed along the direction of width (Y direction) of the substrate.

Whereas, FIG. 10A shows a layout in which the width Wx and the width Wy are set to be equal to each other. The width of the device portion 20 (one drift layer) formed along the X direction in the intersection 23 (the intersection between the drift layers) is equal to the width of the device portion 20 (the other drift layer) formed along the Y direction.

Further, FIG. 10B shows a layout in which the width Wx is set narrower than the width Wy. The width of the device portion 20 (one drift layer) formed along the X direction in the intersection 23 (the intersection between the drift layers) is narrower than the width of the device portion 20 (the other drift layer) formed along the Y direction.

Whereas, FIG. 10C shows a layout in which each intersection 23 (the intersection between the drift layers) has a slit.

Figure 10D:
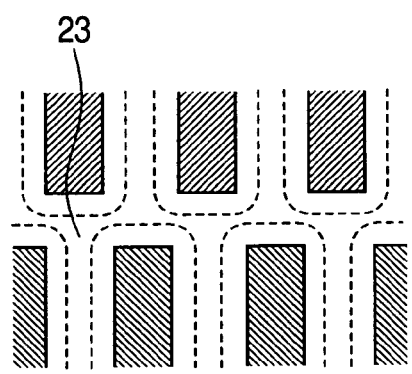

Still further, FIG. 10D shows a layout in which the device portions 20 formed along the X direction and the device portions 20 formed along the X direction are arranged in a staggered configuration. Namely, the intersections between the drift layers are formed in a staggered configuration.

Then, for the example of FIG. 10A, the distance from the intersection 23 to the side of the device portion 20 is large, and hence depletion cannot be sufficiently achieved, resulting in a low breakdown voltage of the device.

On the other hand, for the example of FIG. 10B, the distance from the intersection 23 to the side of the device portion 20 is small, and hence depletion is promoted, resulting in a high breakdown voltage of the device. Whereas, also for the example of FIG. 10C and the example of FIG. 10D, as with the example of FIG. 10B, the distance from the intersection 23 to the side of the device portion 20 is small, and hence depletion is promoted, resulting in a high breakdown voltage of the device.

Therefore, for FIG. 10B, when the width Wx and the width Wy are controlled so as to prevent depletion from being delayed, preferable characteristics can be obtained. Whereas, for FIG. 10C, when the slits 24 are formed so as to prevent depletion from being delayed, preferable characteristics can be obtained. Further, for FIG. 10D, such an arrangement as to prevent depletion from being delayed can provide preferable characteristics.

Figure 11A:
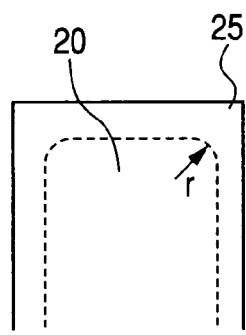
FIGS. 11A and 11B are enlarged diagrams of the device portions of FIGS. 10A to 10D.
Figure 11B:
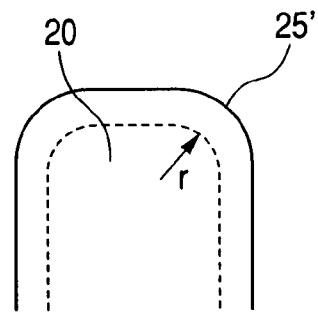

Further, the details of each device portion 20 of FIGS. 10A to 10D will be described by reference to FIGS. 11A and 11B. FIGS. 11A and 11B are each an enlarged diagram of the edge of each device portion of FIGS. 10A to 10D. In the same diagrams, 20 denotes a device portion; 25 and 25', corners; and r, the curvature.

Thus, FIG. 11A shows the case where the curvature r of the joint plane is small. The concentration of the electric field tends to occur, resulting in a low breakdown voltage of the device.

Further, FIG. 11B shows the case where the chamfer of the corner 25' is formed, so that the curvature r is set large. In such a case, the concentration of the electric field is inhibited, resulting in a high breakdown voltage of the device.

Fourthly, a method of manufacturing the semiconductor device of the example of FIG. 5A will be described by reference to FIGS. 12A to 12D. FIGS. 12A to 12D are diagrams showing the steps of the method of manufacturing the semiconductor device of the invention. Incidentally, the same elements as those in FIG. 5A are given the same reference numerals and signs, and the description thereon is omitted.

Figure 12A:
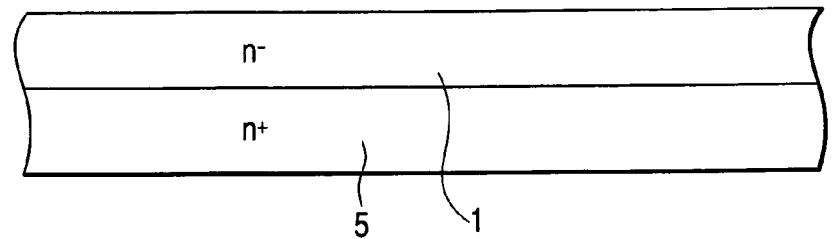
FIGS. 12A to 12D are diagrams showing the steps of a manufacturing method of the invention.

FIG. 12A is a longitudinal cross sectional diagram of a substrate at an initial stage. In the same diagram, the substrate has a thickness large enough in terms of strength. Whereas, the substrate has an $n^+$ layer 5 with a low resistance and a high concentration, and an $n^-$ drift layer 1 having such a thickness and concentration as to result in predetermined breakdown voltage and ON resistance. Further, the $n^+$ layer and the $n^-$ drift layer are joined.

Figure 12B:
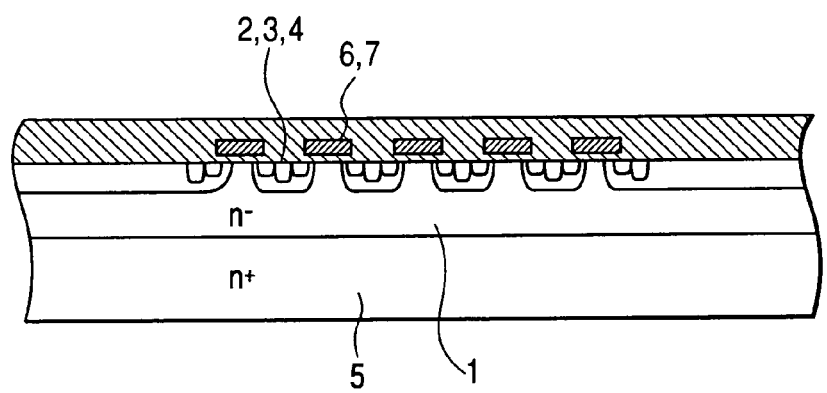

Further, FIG. 12B is a longitudinal cross sectional diagram of the substrate when an impurity layer, and the like are formed on the first principal surface side of the substrate (on the top side of FIG. 12B). In the same diagram, the impurity layer, gate electrodes, and a protective film (a p base layer 2, a $p^+$ layer 3, an $n^+$ layer 4, an oxide film layer 6, and gate electrodes 7), and the like are formed on the substrate.

Figure 12C:
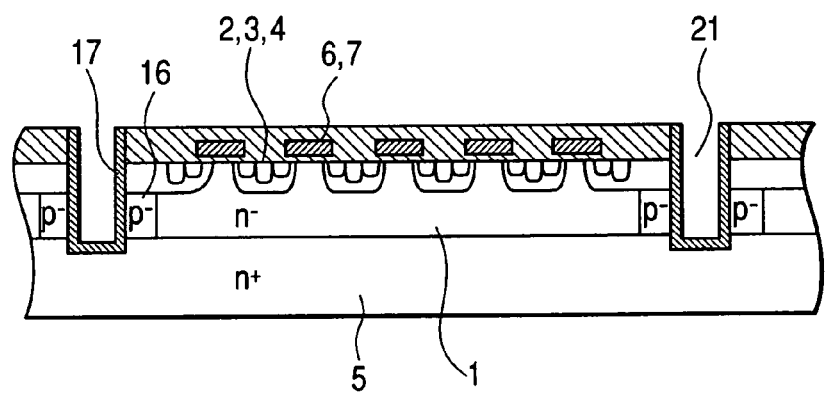

Still further, FIG. 12C is a longitudinal cross sectional diagram when the side of the device has been formed. In the same diagram, an isolation trench 21 is formed in the $n^-$ drift layer 1 (drift layer) of the substrate, and a $p^-$ layer 16 (low concentration layer) is formed on the side of the isolation trench 21. Then, an oxide film layer 17 is formed on the outside of the $p^+$ layer 16 (low concentration layer).

Figure 12D:
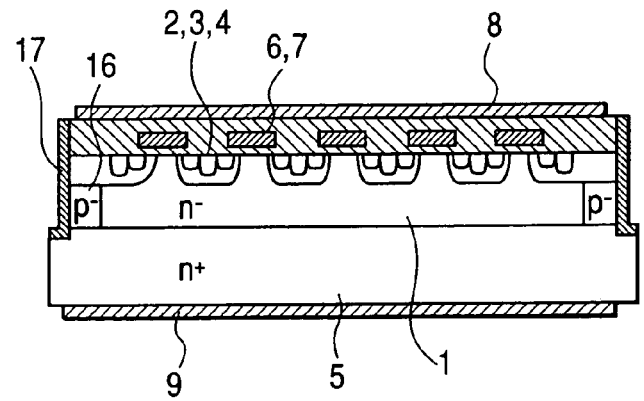

Whereas, FIG. 12D is a longitudinal cross sectional diagram of the substrate when a source electrode 8 and a drain electrode 9 have been formed, followed by dicing.

First, as shown in FIG. 12A, a step of forming the $n^+$ layer 5 (high concentration layer) and the n drift layer 1 (low concentration layer) is carried out.

Further, the $n^+$ layer 5 is formed so as to have a low resistance and a thickness large enough in terms of strength.

For example, a bonded wafer of the high concentration $n^+$ layer 5 and the low concentration $n^-$ drift layer 1 is used.

Alternatively, other than the foregoing, a high concentration layer may be diffused and formed in a low concentration substrate.

Further alternatively, other than the foregoing, a high concentration layer or a low concentration layer may be formed by epitaxial growth.

Subsequently, as shown in FIG. 12B, a step of forming an impurity layer or the like on the first principal surface side of the substrate (on the top side of FIG. 12B) is carried out.

Still subsequently, a step of forming each isolation trench 21 in the portion which becomes conduction in the ON state, and is depleted in the OFF state of the drift layer is carried out.

Further, the isolation trench 21 and the $n^-$ drift layer 1 (drift layer) may have an inclination.

For example, the isolation trench 21 is formed using vapor phase etching with a high aspect ratio.

Further, other than the foregoing, for example, the isolation trench 21 is formed using liquid phase etching with a plane anisotropy according to the crystal orientation.

Further, other than the foregoing, for example, the isolation trench 21 is formed using mechanical grinding such as dicing or sandblasting, for example.

Further subsequently, a step of etching and removing a defective and damage layer is carried out (however, this step may be omitted).

Incidentally, the step of etching and removing a defective and damage layer has an effect of stabilizing the characteristics of the semiconductor device.

Further subsequently, a step of forming the $p^-$ layer 16 (low concentration layer) on the side of the isolation trench 21 is carried out.

Further, the $p^-$ layer 16 (low concentration layer) is formed to be of a p type which is the opposite conductivity type to that of the $n^-$ drift layer 1 (drift layer).

For example, the $p^-$ layer 16 (low concentration layer) is formed by epitaxial growth.

Further, other than the foregoing, for example, the $p^-$ layer 16 (low concentration layer) is formed by an ion implantation method.

Still further, other than the foregoing, for example, a solid phase, liquid phase, or gas phase impurity source is applied at a predetermined temperature and for a predetermined period of time to form the $p^-$ layer 16 (low concentration layer).

Further subsequently, as shown in FIG. 12C, a step of forming the oxide film layer 17 is carried out (however, this step may be omitted).

Still further subsequently, a step of forming the source electrode 8 and the drain electrode 9 is carried out.

Furthermore subsequently, as shown in FIG. 12D, a step of performing the dicing of the inside of the isolation trench 21 is carried out.

Fifthly, particularly, a method of manufacturing a semiconductor device having a stable breakdown voltage characteristic will be described in details.

Figure 13:
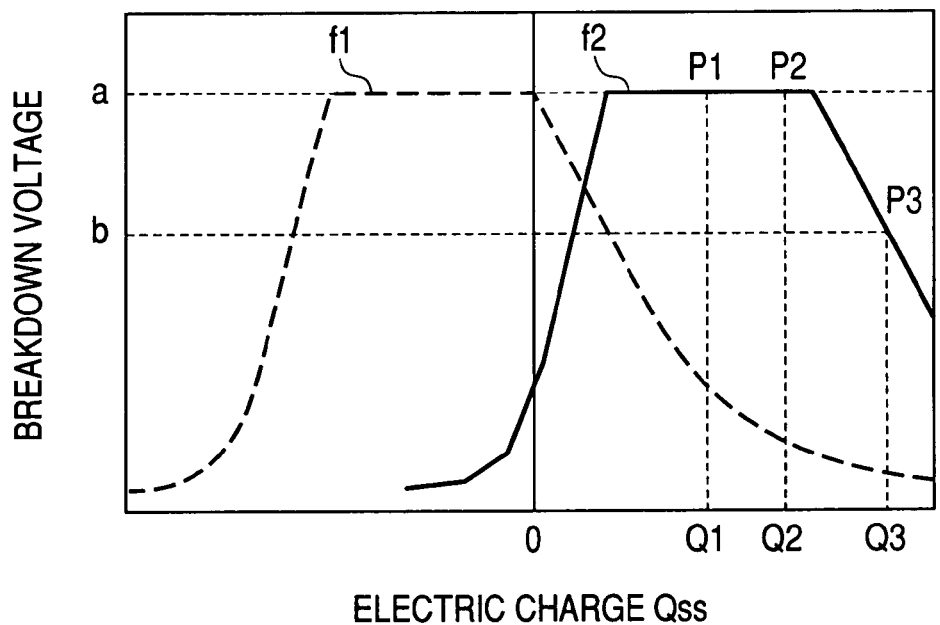
FIG. 13 is a characteristic diagram showing the characteristics of the breakdown voltage versus the electric charge of an oxide film layer 17 in the example of FIG. 5A.

FIG. 13 is a characteristic diagram showing the characteristics of the breakdown voltage versus the electric charge of the oxide film layer 17 in the example of FIG. 5A. Namely, FIG. 13 shows the electric charge versus breakdown voltage characteristics. Further, FIG. 13 corresponds to FIG. 8. The abscissa denotes the electric charge Qss in the oxide film layer 17, and the ordinate denotes the breakdown voltage of the device.

Whereas, in FIG. 13, the characteristic f1 of the broken line is the characteristic for the case where the $p^-$ layer 16 has been deleted in the example of FIG. 5A. The characteristic f2 of the solid line is the characteristic for the case of the example of FIG. 5A. Thus, the characteristic f1 and the characteristic f2 are both equal to, or smaller than the ideal breakdown voltage a.

Further, the characteristic f2 is the one obtained by translating the characteristic f1 in the positive direction of the electric charge Qss. Thus, the degree of the translation is determined by the thickness t1 of the p$^-$ layer 16 and the concentration of the p$^-$ layer 16.

Still further, for the characteristic f1, when the electric charge Qss increases from zero, the breakdown voltage of the device monotonously decreases. Whereas, for the characteristic f2, when the electric charge Qss increases from zero, the line indicative of the breakdown voltage of the device has a region where the breakdown voltage is increasing and a region where the breakdown voltage becomes constant at the ideal breakdown voltage a.

Whereas, when the electric charge Qss is the electric charge amount Q1 (Q1>0), the breakdown voltage of the example of FIG. 5A becomes the ideal breakdown voltage a. Thus, the characteristic of the solid line f2 becomes the median value P1 of the region in which the breakdown voltage becomes constant at the ideal breakdown voltage a. Then, in this case, the example of FIG. 5A becomes a semiconductor device stable to any of the external plus electric charge or the external minus electric charge.

Further, when the electric charge Qss is the electric charge amount Q2 (Q2>Q1), the breakdown voltage of the example of FIG. 5A becomes the ideal breakdown voltage a. Thus, the characteristic of the solid line f2 becomes the value P2 shifted in the direction of the electric charge Qss from the median value P1 of the region in which the breakdown voltage becomes constant at the ideal breakdown voltage a. Then, the example of FIG. 5A becomes a semiconductor device stable to the external minus electric charge. Incidentally, for the example of FIG. 5A, the breakdown voltage of the device is reduced in response to the external plus electric charge.

Thus, the example of FIG. 5A becomes a semiconductor device having stable breakdown voltage characteristics when the thickness t1 of the p$^-$ layer 16 and the concentration of the p$^-$ layer 16 are set at predetermined values. Incidentally, generally, the electric charge Qss in the oxide film layer 17 becomes a positive electric charge.

Figure 14:
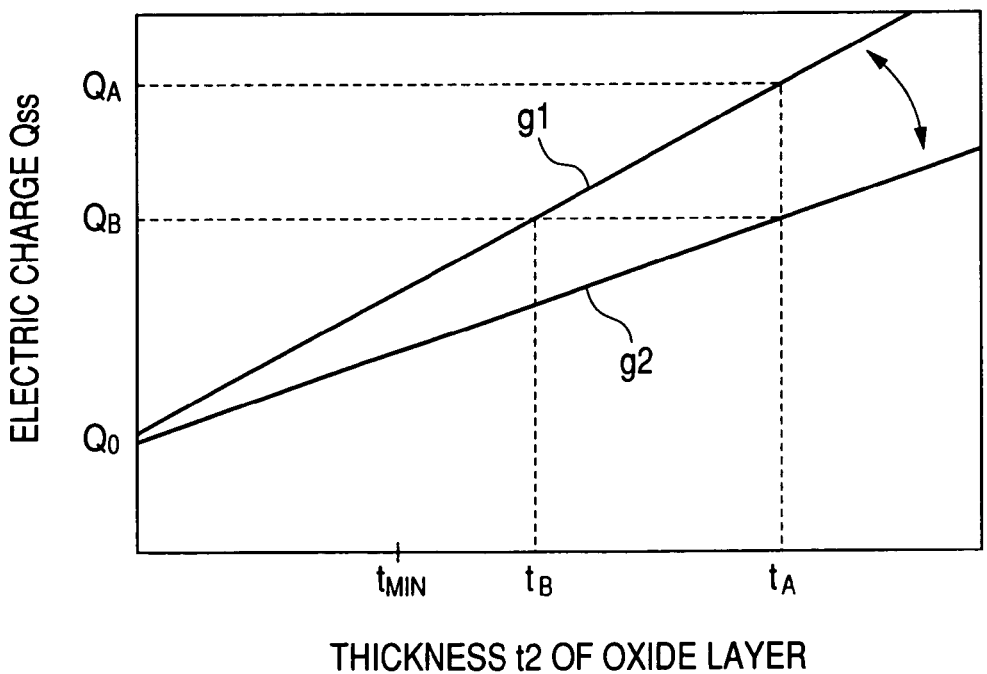
FIG. 14 is a characteristic diagram showing the characteristics of the electric charge Qss versus the thickness t2 of the oxide film layer 17 in the example of FIG. 5A.

Whereas, FIG. 14 is a characteristic diagram showing the characteristics of the electric charge Qss versus the thickness t2 of the oxide film layer 17 in the example of FIG. 5A. The abscissa denotes the thickness t2 of the oxide film layer 17, and the ordinate denotes the electric charge Qss.

In the same diagram, the electric charge Qss linearly increases with an increase in thickness t2. Specifically, the electric charge Qss has a component not dependent on the thickness t2, and a component proportional to the thickness t2. Examples of the component not dependent on the thickness t2 include an electric charge to be trapped in the interface.

Further, the electric charge Qss in the oxide film layer 17 varies depending upon the process conditions, and exhibits variations. In FIG. 14, the characteristic g1 shows the characteristic that the change in electric charge Qss is maximum, and the characteristic g2 shows the characteristic that the change in electric charge Qss is minimum. Namely, the characteristic diagram of FIG. 14 shows the case where variations of the example of FIG. 5A fluctuate from the characteristic g1 to the characteristic g2.

As for such an example of FIG. 5A, when the thickness t2 is the thickness tA, the electric charge Qss fluctuates from the electric charge amount QA to the electric charge amount QB.

Whereas, in order to set the electric charge Qss at a predetermined electric charge amount QB, the thickness t2 of the oxide film layer 17 is set at a value between the thickness tB and the thickness tA.

Therefore, in order to set the electric charge Qss of the example of FIG. 5A at a predetermined electric charge amount QB, first, a step of setting the thickness t2 of the oxide film layer 17 at the thickness tA is carried out. Namely, the oxide film layer 17 is formed so that the thickness t2 thereof becomes roughly the thickness based on the worst conditions of the process.

Then, a step of reducing the thickness t2 based on the electric charge amount determined by a monitor is carried out.

For example, when the electric charge Qss for the configuration in which the thickness t2 is the thickness tA is the electric charge amount QB, the thickness t2 is kept to be the thickness tA. Whereas, when the electric charge Qss for the configuration in which the thickness t2 is the thickness tA is the electric charge amount QA, the thickness t2 is reduced down to the thickness tB by etching.

Incidentally, the thicknesses tA and tB are larger than the film thickness tMIN necessary for protection.

As indicated by the foregoing, with the method of manufacturing the example of FIG. 5A having stable breakdown voltage characteristics, the thickness t2 of the oxide film layer 17 is set at a predetermined value, and the electric charge Qss in the oxide film layer 17 is set at a predetermined value. The method includes a step of forming the p$^-$ layer 16, a step of forming the oxide film layer 17 with the thickness tA, and a step of reducing the thickness t2 of the oxide film layer 17 based on the electric charge amount to be determined by a monitor.

Such an example of FIG. 5A having stable breakdown voltage characteristics can inhibit the breakdown voltage failure, and can include a margin for long-term fluctuations.

Figure 15:
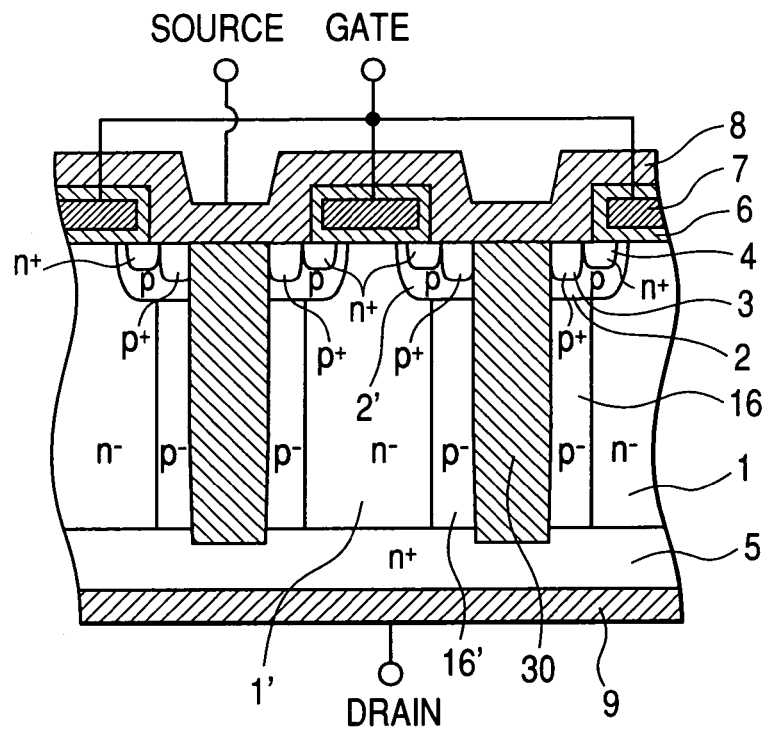
FIG. 15 is a longitudinal cross sectional diagram of a vertical DMOS showing a second example of the invention.

Whereas, FIG. 15 is a longitudinal cross sectional diagram of a vertical DMOS showing a second example in the semiconductor device in accordance with the invention. Incidentally, the same elements as those in the example of FIG. 5A are given the same reference numerals and signs, and the description thereon is omitted.

The example of FIG. 15 is characterized by including a p$^-$ layer 16 (first low concentration layer), a p$^-$ layer 16' (second low concentration layer), and an oxide film layer 30 (insulating material).

Incidentally, in the example of FIG. 15, a reference numeral 1 denotes an n$^-$ drift layer (first drift layer); 1', an n$^-$ drift layer (second drift layer); 2, a p base layer (a part of a first active region); 2', a p base layer (a part of a second active region); 16, a p$^-$ layer (first low concentration layer); 16', a p$^-$ layer (second low concentration layer); and 30, an oxide film layer (insulating material).

Further, as with the example of FIG. 5A, on a substrate, a source electrode 8 (first electrode) and a drain electrode 9 (second electrode) are included.

Whereas, as with the example of FIG. 5A, the n$^-$ drift layer 1 (first drift layer) is included between the p base layer 2 (a part of the first active region on the first electrode side) and the drain electrode 9 (second electrode).

Then, as with the example of FIG. 5A, the n$^-$ drift layer 1 (first drift layer) becomes conduction in the ON state of the device, and is depleted in the OFF state of the device.

Further, as with the example of FIG. 5A, the n$^-$ drift layer 1' (second drift layer) is included between the p base layer 2' (a part of the second active region on the first electrode side) and the drain electrode 9 (second electrode).

Then, as with the example of FIG. 5A, the n⁻ drift layer 1' (second drift layer) becomes conduction in the ON state of the device, and is depleted in the OFF state of the device.

Further, the p⁻ drift layer 16 (first low concentration layer) is formed on the side of the n⁻ drift layer 1 (first drift layer).

Whereas, the p⁻ drift layer 16 (first low concentration layer) is formed on the side with respect to the direction (longitudinal direction) from the p base layer 2 (a part of the first active region of the first drift layer) to the drain electrode 9 (second electrode).

Still further, the p⁻ drift layer 16 (first low concentration layer) is formed to be of a p type which is the opposite conductivity type to that of the n⁻ drift layer 1 (first drift layer).

Whereas, the p⁻ drift layer 16' (second low concentration layer) is formed on the side of the n⁻ drift layer 1' (second drift layer).

Whereas, the p⁻ drift layer 16' (second low concentration layer) is formed on the side with respect to the direction (longitudinal direction) from the p base layer 2' (a part of the second active region of the first drift layer) to the drain electrode 9 (second electrode).

Still further, the p⁻ layer 16' (second low concentration layer) is formed to be of a p type which is the opposite conductivity type to that of the n⁻ drift layer 1' (second drift layer).

Moreover, an oxide film layer 30 (insulating material) is included between the p⁻ layer 16 (first low concentration layer) and the p layer 16' (second low concentration layer).

Such an example of FIG. 15 corresponds to the one obtained by backfilling the isolation trench 21 with the oxide film layer 30 (insulating material), and planarizing it in each example of FIGS. 9A to 9D and 10A to 10D.

Therefore, the example of FIG. 15 has the same preferable effects as with the example of FIG. 5A.

Whereas, for the example of FIG. 15, each width of the n⁻ drift layers 1 and 1' can be narrowed. For this reason, each concentration of the n⁻ drift layers 1 and 1' can be increased. Therefore, it is possible to achieve the large reduction of the size even in consideration of the oxide film layer 30.

Further, with the method of manufacturing the example of FIG. 15, after a step of forming the p layer 16 (first low concentration layer) and the p⁻ layer 16' (second low concentration layer), a step of backfilling the isolation trench 21 with the oxide film layer 30 (insulating material) is carried out.

Specifically, the method of manufacturing the example of FIG. 15 includes: a step of forming the n⁺ layer 5, and the n⁻ drift layers 1 and 1'; a step of forming an impurity layer (the p base layer 2, the p⁺ layer 3, the n⁺ layer 4, the oxide film layer 6, and the gate electrode 7), and the like on the first principal surface side of the substrate (on the tope side of FIGS. 12A to 12D); a step of forming an isolation trench in the n⁻ drift layers 1 and 1'; a step of forming the p⁻ layers 16 and 16' (low concentration layers) on the side of the isolation trench; a step of backfilling the isolation trench with the oxide film layer 30 (insulating material); and a step of forming the source electrode 8 and the drain electrode 9.

Still further, with the method of manufacturing the example of FIG. 15, a device may be formed after the step of backfilling the isolation trench with the oxide film layer 30 (insulating material).

Specifically, the method of manufacturing the example of FIG. 15 may be configured to include: a step of forming the n⁺ layer 5, and the n⁻ drift layers 1 and 1'; a step of forming an isolation trench in the n⁻ drift layers 1 and 1'; a step of forming the p⁻ layers 16 and 16' (low concentration layers) on the side of the isolation trench; a step of backfilling the isolation trench with the oxide film layer 30 (insulating material); a step of forming an impurity layer (the p base layer 2, the p⁺ layer 3, the n⁺ layer 4, the oxide film layer 6, and the gate electrode 7), and the like on the first principal surface side of the substrate (on the top side of FIGS. 12A to 12D); and a step of forming the source electrode 8 and the drain electrode 9.

Figure 16:
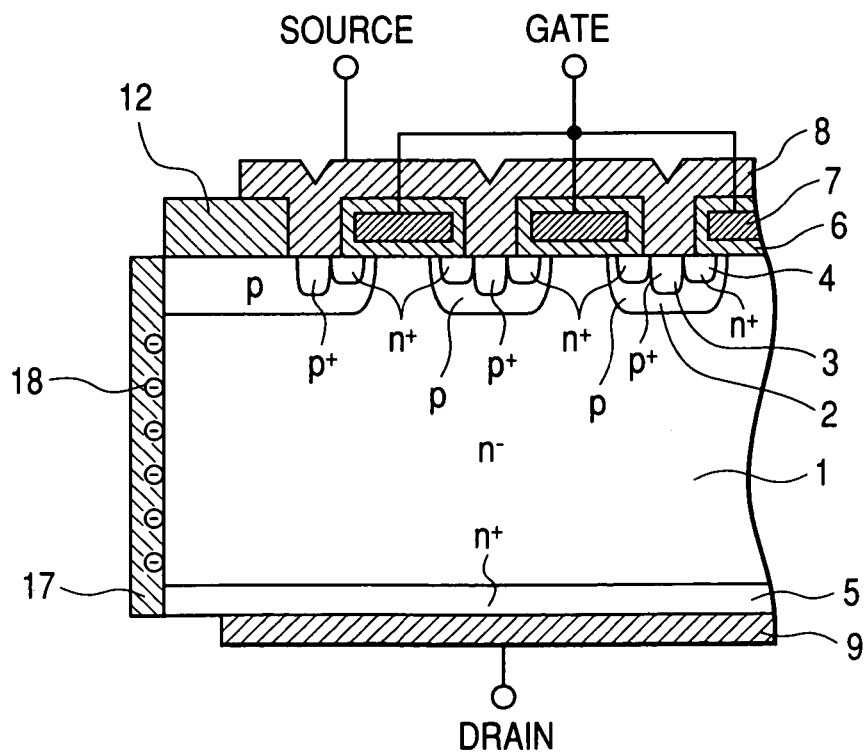
FIG. 16 is a longitudinal cross sectional diagram of a vertical DMOS showing a third example of the invention.

Whereas, FIG. 16 is a longitudinal cross sectional diagram of a vertical DMOS showing a third example in the semiconductor device in accordance with the invention. Incidentally, the same elements as those in the example of FIG. 5A are given the same reference numerals and signs, and the description thereon is omitted.

The example of FIG. 16 is characterized by including an oxide film layer 17 having a minus electric charge 18.

Whereas, the oxide film 18 is formed on the physical end of the side of the n⁻ drift layer 1. Namely, the oxide film 18 is formed on the outermost side of the n⁻ drift layer 1.

Further, the oxide film 18 is formed on the physical end of the side with respect to the direction from a source electrode 8 (first electrode) toward a drain electrode 9 (second electrode). Namely, the oxide film 18 is formed on the outermost side with respect to the direction from the source electrode 8 (first electrode) toward the drain electrode 9 (second electrode).

Still further, such a method of manufacturing the example of FIG. 16 having an n type drift layer may include a step of injecting a minus electric charge 18 after the step of forming the oxide film 18. Alternatively, the method may include a step of forming the oxide film 18 and injecting a minus electric charge 18.

Specifically, the method of manufacturing the example of FIG. 16 includes: a step of forming the n⁺ layer 5, and the n⁻ drift layer 1; a step of forming an impurity layer, and the like on the first principal surface side of the substrate (on the top side of FIGS. 12A to 12D); a step of forming an isolation trench 21 in the n⁻ drift layer 1; a step of forming the oxide film layer 17 on the side of the isolation trench 21; a step of injecting the minus electric charge 18 in the oxide film layer 17; a step of forming the source electrode 8 and the drain electrode 9; and a step of performing the dicing of the inside of the isolation trench 21.

Whereas, the method of manufacturing the example of FIG. 16 is configured to include, as an alternative to the foregoing manufacturing method,: a step of forming the n⁺ layer 5, and the n⁻ drift layer 1; a step of forming an impurity layer, and the like on the first principal surface side of the substrate (on the top side of FIGS. 12A to 12D); a step of forming an isolation trench 21 in the n⁻ drift layer 1; a step of forming the oxide film layer 17 on the side of the isolation trench 21, and injecting a minus electric charge 18 in the oxide film layer 17; a step of forming the source electrode 8 and the drain electrode 9; and a step of performing the dicing of the inside of the isolation trench 21.

In such an example of FIG. 16, the vicinity of the interface between the n⁻ drift layer 1 and the oxide film layer 17 is changed to have a characteristic of p⁻ type by the minus electric charge 18.

Therefore, the structure equivalent to that of the example of FIG. 16 is the same structure as the structure of the example of FIG. 5A, and hence produces the same preferable effects.

Further, a description will be given to the case where the n type is replaced with the p type, and the p type is replaced with the n type in the example of FIG. 16 (not shown). In this case, the drift layer 1 is formed to be of a p type.

In such a semiconductor device in which the drift layer 1 is of a p type, the vicinity of the interface between the n⁻ drift layer 1 and the oxide film layer 17 is changed to have a characteristic of n⁻ type by the fixed electric charge included in the oxide film layer 17. Therefore, the same effects as those with the example of FIG. 16 are produced.

Then, when the thickness of the oxide film layer 17 and the processing method of the oxide film layer 17 are controlled to control the fixed electric charge of the oxide film layer 17, preferable characteristics can be obtained.

Then, the manufacturing method for the case where the p type drift layer 1 has a p type conductivity does not require a step of injecting the electric charge 18 after the step of forming the oxide film layer 17 as distinct from the case where the drift layer 1 is of an n type.

Specifically, the method includes: a step of forming the n⁺ layer 5, and the n⁻ drift layer 1; a step of forming an impurity layer, and the like on the first principal surface side of the substrate (on the top side of FIGS. 12A to 12D); a step of forming an isolation trench 21 in the n⁻ drift layer 1; a step of forming the oxide film layer 17 having a predetermined fixed electric charge on the side of the isolation trench 21; a step of forming the source electrode 8 and the drain electrode 9; and a step of performing the dicing of the inside of the isolation trench 21.

Figure 17:
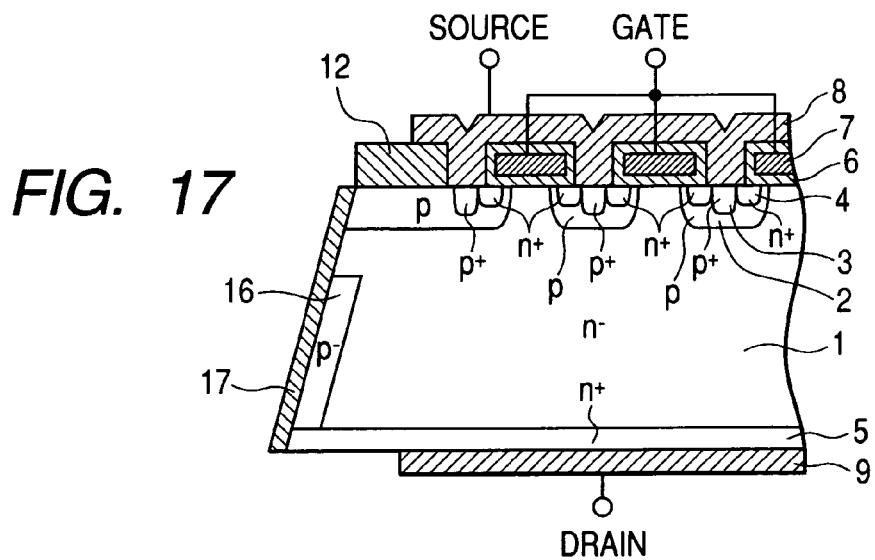
FIG. 17 is a longitudinal cross sectional diagram of a vertical DMOS showing a fourth example of the invention.

Whereas, FIG. 17 is a longitudinal cross sectional diagram of a vertical DMOS showing a fourth example in the semiconductor device in accordance with the invention. Incidentally, the same elements as those in the example of FIG. 5A are given the same reference numerals and signs, and the description thereon is omitted.

A first feature of the example of FIG. 17 resides in that the p⁻ layer 16 (low concentration layer) and the n⁻ drift layer 1 (drift layer) are joined to each other with an inclination.

Further, a second feature of the example of FIG. 17 resides in that the n⁻ drift layer 1 (drift layer) is included between the p base layer 2 (a part of the active region on the first electrode side) and the p⁻ layer 16 (low concentration layer).

Even with such a configuration, the operation of the example of FIG. 17 becomes roughly the same as the operation of the example of FIG. 5A. Therefore, the example of FIG. 17 produces the same preferable effects as those of the example of FIG. 5A.

Figure 18:
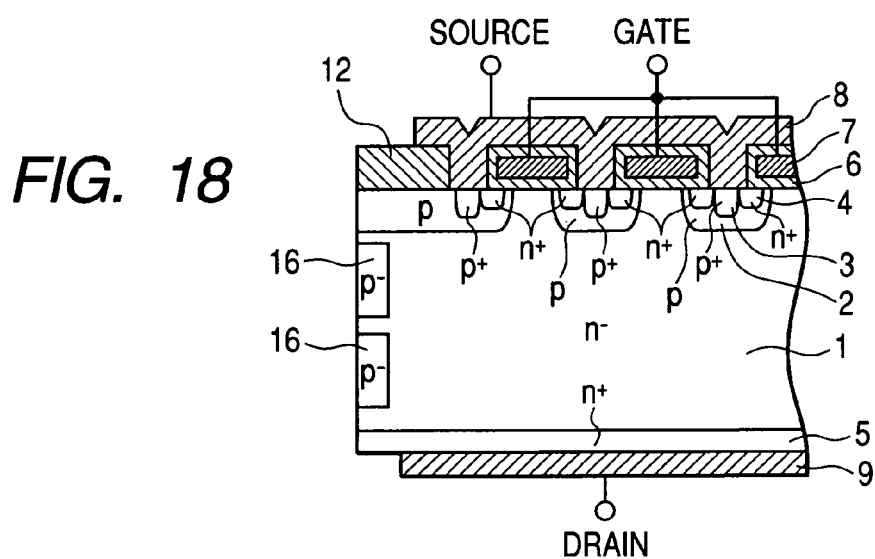
FIG. 18 is a longitudinal cross sectional diagram of a vertical DMOS showing a fifth example of the invention.

Whereas, FIG. 18 is a longitudinal cross sectional diagram of a vertical DMOS showing a fifth example in the semiconductor device in accordance with the invention. Incidentally, the same elements as those in the example of FIG. 5A are given the same reference numerals and signs, and the description thereon is omitted.

A first feature of the example of FIG. 18 resides in that no-oxide film layer is included on the outside of the p⁻ layer 16.

Further, a second feature of the example of FIG. 18 resides in that a plurality of the p⁻ layers 16 (low concentration layers) are formed.

Even with such a configuration, the operation of the example of FIG. 18 becomes roughly the same as the operation of the example of FIG. 5A. Therefore, the example of FIG. 18 produces the same preferable effects as those of the example of FIG. 5A. Incidentally, the example of FIG. 5A has more stable characteristics than those of the example of FIG. 18.

Figure 19:
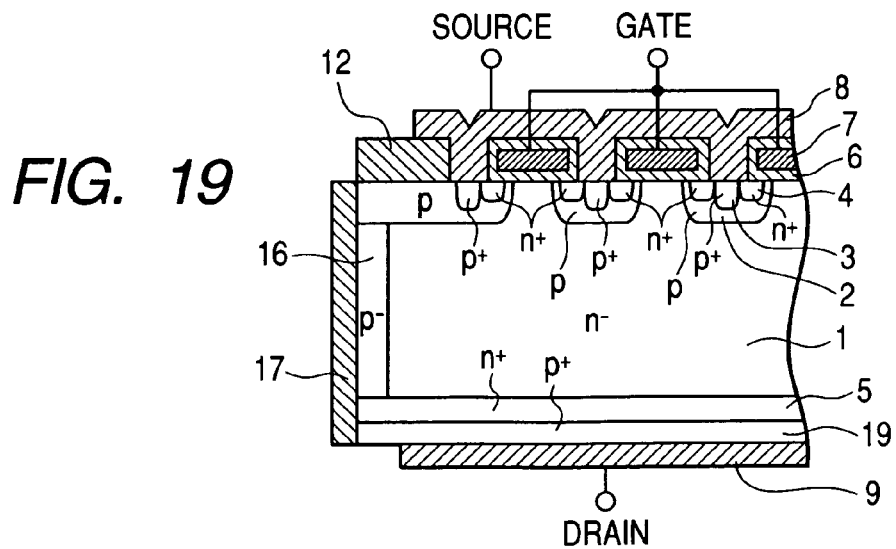
FIG. 19 is a longitudinal cross sectional diagram of an IGBT showing a sixth example of the invention.

Whereas, FIG. 19 is a conductivity modulation type MOSFET (IGBT) showing a sixth example in the semiconductor device in accordance with the invention. Incidentally, the same elements as those in the example of FIG. 5A are given the same reference numerals and signs, and the description thereon is omitted.

A feature of the example of FIG. 19 resides in that the conductivity modulation type MOSFET (IGBT) includes the p⁻ layer 16 (low concentration layer) as with the feature of the example of FIG. 5A.

Therefore, the operation of the example of FIG. 19 has the same function as with the operation of the example of FIG. 5A. Thus, the example of FIG. 19 provides preferable characteristics of being simple, low in cost, and small in size, and having a low ON resistance, and a high breakdown voltage as with the example of FIG. 5A.

Figure 20:
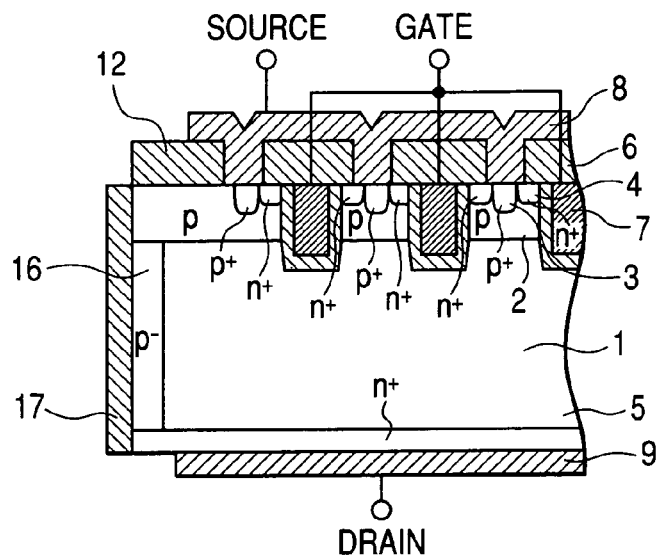
FIG. 20 is a longitudinal cross sectional diagram of a trench type MOS showing a seventh example of the invention.

Whereas, FIG. 20 is a longitudinal cross sectional diagram of a trench type MOS showing a seventh example in the semiconductor device in accordance with the invention. Incidentally, the same elements as those in the example of FIG. 5A are given the same reference numerals and signs, and the description thereon is omitted.

A feature of the example of FIG. 20 resides in that the trench type MOS includes the p⁻ layer 16 (low concentration layer) as with the feature of the example of FIG. 5A.

Even with such a configuration, the operation of the example of FIG. 20 has the same function as with the operation of the example of FIG. 5A. Thus, the example of FIG. 20 provides preferable characteristics of being simple, low in cost, and small in size, and having a low ON resistance, and a high breakdown voltage as with the example of FIG. 5A.

Figure 21:
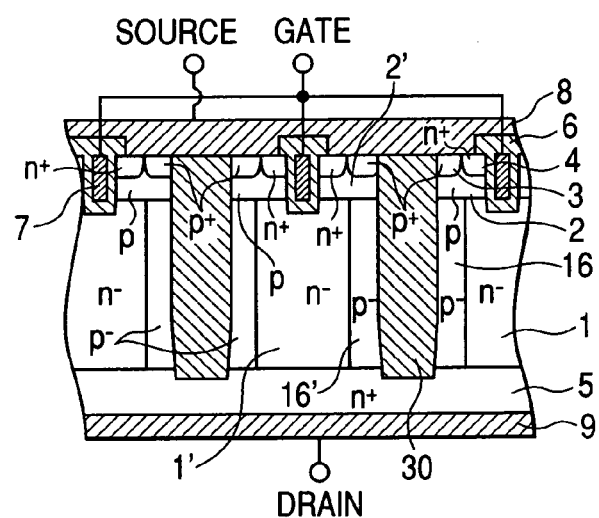
FIG. 21 is a longitudinal cross sectional diagram of a trench type MOS showing an eighth example of the invention.

Further, FIG. 21 is a longitudinal cross sectional diagram of a trench type MOS showing an eighth example in the semiconductor device in accordance with the invention. Incidentally, the same elements as those in the example of FIG. 15 are given the same reference numerals and signs, and the description thereon is omitted.

A feature of the example of FIG. 21 resides in that the trench type MOS includes the p⁻ layer 16 (first low concentration layer) and the p⁻ layer 16' (second low concentration layer), and the oxide film layer 30 (insulating material) as with the example of FIG. 15.

Even with such a configuration, the operation of the example of FIG. 21 has the same function as with the operation of the example of FIG. 15. Thus, the example of FIG. 20 provides preferable characteristics of being simple, low in cost, and small in size, and having a low ON resistance, and a high breakdown voltage as with the example of FIG. 15.

Figure 22:
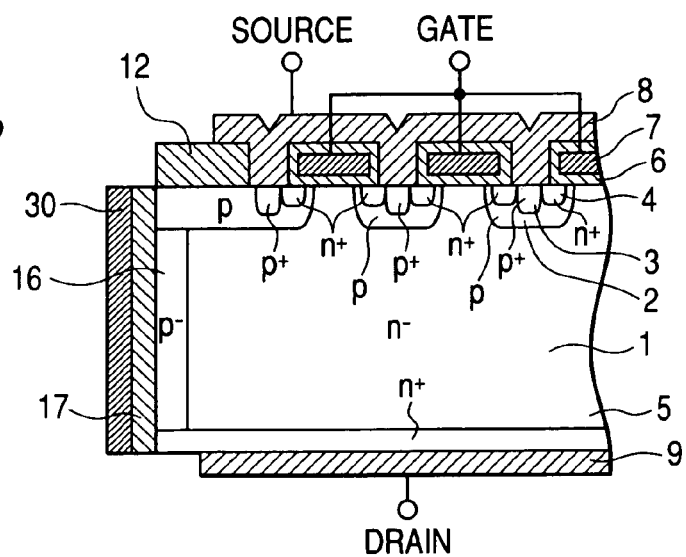
FIG. 22 is a longitudinal cross sectional diagram of a vertical DMOS showing a ninth example of the invention.

Whereas, FIG. 22 is a longitudinal cross sectional diagram of a vertical DMOS showing a ninth example in the semiconductor device in accordance with the invention. Incidentally, the same elements as those in the example of FIG. 5A are given the same reference numerals and signs, and the description thereon is omitted.

A feature of the example of FIG. 22 resides in that a charge control film 30 is included.

In the same diagram, an oxide film layer 17 (insulating material) with a predetermined thickness is included on the outside of the p⁻ layer 16. Further, the charge control film 30 is deposited on the outside of the oxide film layer 17.

Further, the electric charge in the charge control film 30 is controlled, so that the example of FIG. 22 has a predetermined electric charge amount versus breakdown voltage characteristic. Incidentally, for the charge control film 30, a material showing less variations in electric charge amount than the oxide film layer 17 is used.

A specific method of manufacturing such an example of FIG. 22 includes a step of forming the p layer 16, and a step of forming the charge control film 30 on the outside of the insulating material according to the electric charge amount to be determined by a monitor.

Then, this example is different from the example of FIG. 5A in the following respects: the thickness t2 of the oxide film layer 17 is reduced by etching in the example of FIG. 5A; in contrast, an etching step is not carried out in the example of FIG. 22.

Therefore, the example of FIG. 22 with such a configuration has stable breakdown characteristics as with the example of FIG. 5A.

Similarly, although the foregoing examples were a double-diffused MOS (DMOS), a conductivity modulation type MOSFET (IGBT), and a trench type MOS, other than these, even a general insulation gate type field effect transistor (MOSFET), a bipolar transistor, a diode, a thyristor, a super-junction type MOS, and the like produce the same preferable effects.

In the foregoing examples, the conductivity type of the drift layer ($n^-$ drift layer 1) was n type. However, other than these, even when the conductivity type of the drift layer is p type which is the opposite type, the same preferable effects are produced. Thus, the low concentration layer in this case is of an n type.

Each foregoing example was a semiconductor device of a vertical structure. However, other than this, even a semiconductor device of a horizontal structure produces the same preferable effects.

In each foregoing example, the substrate was silicon (Si). However, other than this, even when the substrate is silicon carbide (SiC), the same preferable effects are produced.

Some of the foregoing examples each have the oxide film layer 17 (insulating material) or the oxide film layer 30 (insulating material). However, other than this, even when the component corresponding to the oxide film layer 17 or the component corresponding to the oxide film layer 30 is formed of a dielectric material, the same preferable functions and effects are produced.

As described above, the invention is not limited to the foregoing examples, and include still more variations and modifications within the scope not departing from the gist thereof.

As indicated by the foregoing description, in accordance with the invention, it is possible to provide a simple, low cost, small sized, low ON resistance, and high breakdown voltage semiconductor device, and a method of manufacturing the semiconductor device.

Further, in accordance with the invention, it is possible to inhibit the effects of the external electric charges.

Further, in accordance with the invention, it is possible to provide a semiconductor device having stable breakdown voltage characteristics, and a method of manufacturing the semiconductor device.

Figure 23:
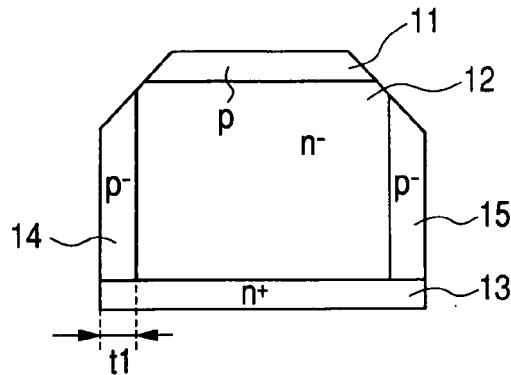
FIG. 23 is a longitudinal cross sectional diagram showing a basic unit of a diode part in one example of the invention.

Below, the invention will be described in details by reference to FIG. 23. FIG. 23 is a longitudinal cross sectional diagram showing the basic unit of the diode part in one example of the invention. The base layer 11, the drift layer 12, the $n^+$ layer 13, the side p layer 14, and the side p layer 15 of the example of FIG. 23 correspond to the base layer 41, the drift layer 42, the $n^+$ layer 43, the side p layer 44, and the side p layer 45 of the examples of FIG. 3, respectively.

A feature of the example of FIG. 23 resides in the configuration of the side p layer 14 and the side p layer 15 which are low concentration layers.

The side p layer 14 and the side p layer 15 are configured to float off the base layer 11. Specifically, the configuration is formed such that no direct contact is established between the side p layer 14 and the side p layer 15, and the base layer 11. Then, the side p layer 14 and the side p layer 15 are joined to the base layer 11 via the drift layer 12.

Whereas, the side p layer 14 and the side p layer 15, and the base layer 11 have a distance from each other based on the thickness of the depletion layer generated at a predetermined reverse bias. In other words, the side p layer 14 and the side p layer 15, and the base layer 11 are formed so as to have an appropriate distance from each other, and formed so as not to be too apart from each other.

Specifically, the distance between the side p layer 14 and the side p layer 15, and the base layer 11 is larger than the thickness of the depletion layer generated at a reverse bias in the OFF state of the steady application.

Further, for the example of FIG. 23, the region between the side p layer 14 and the side p layer 15, and the base layer 11 is formed in a mesa structure. Namely, the side p layer 14 and the side p layer 15, the base layer 11, and the top (the top of the side) of the first principal surface side of the drift layer 12 are removed. Thus, the top of the side becomes inclined, so that the width of the base layer 11 becomes smaller than the width of the $n^+$ layer 13 (width of the device).

Figure 24A:
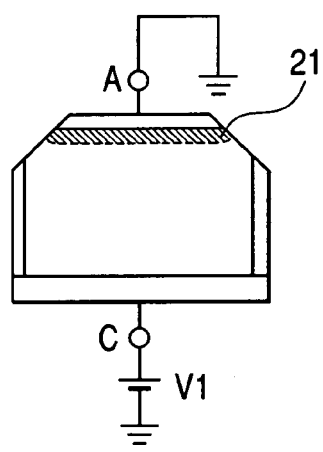
FIGS. 24A and 24B are cross sectional diagrams each showing the distribution of a depletion layer for reverse bias in the example of FIG. 23.
Figure 24B:
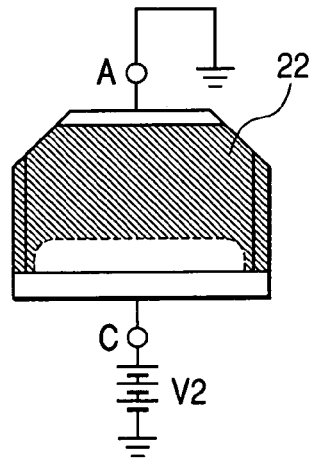

The operation of such an example of FIG. 23 will be described by reference to FIGS. 24A and 24B. FIGS. 24A and 24B are each a longitudinal cross sectional diagram showing the distribution of the depletion layer at a reverse bias in the example of FIG. 23. The examples of FIGS. 24A and 24B correspond to the examples of FIGS. 4A and 4B.

First, when a low voltage V1 is applied, i.e., at a reverse bias of the steady application, the depletion layer 21 is expanded. The depletion layer 21 is generated in such a manner as to expand from the junction plane between the base layer 11 and the drift layer 12. Thus, no depletion layer is generated at the junction plane between the side p layer 14 and the side p layer 15, and the drift layer 12. Further, the side p layer 14 and the side p layer 15 are not depleted.

In other words, the distance between the side p layer 14 and the side p layer 15, and the base layer 11 is larger than the thickness of the depletion layer generated at a reverse bias in the OFF state of the steady application. Whereas, the depletion layer 21 of the example of FIG. 24A is different from the depletion layer 51 of the example of FIG. 4A. Further, the side p layer 14 and the side p layer 15, and the base layer 11 are in floating relation, and hence different in electric potential.

Therefore, for the example of FIG. 23, when the low voltage V1 is applied, the volume of the depletion layer is reduced, resulting in a reduction of the leakage current. Whereas, when the crystallinity of the side p layer 14 and the side p layer 15 is inferior, the leakage current can be controlled to a low level effectively.

Further, the electric charges at the junction are balanced by forming the top of the side in a mesa structure. Therefore, the generation of the depletion layer in the vicinity of the side of the drift layer 12 is inhibited. Specifically, the depletion layer 21 is inhibited from expanding at the mesa-structured portion of the drift layer 12. In other words, the expansion of the depletion layer 21 to the mesa-structured portion (in the oblique direction) is smaller than the expansion of the depletion layer 21 in the thickness direction (longitudinal direction) of the device.

As a result, for the example of FIG. 23, by forming the device in a mesa structure, it is possible to reduce the distance between the side p layer 14 and the side p layer 15, and the base layer 11 while ensuring the reverse bias.

Then, when a high voltage V2 is applied, the depletion layer 22 reaches the side p layer 14 and the side p layer 15. Then, the side p layer 14 and the side p layer 15 are depleted to be integral with the depletion layer 22. Thus, the depletion layer 22 of the example of FIG. 24B becomes equivalent to the depletion layer 52 of the example of FIG. 4B.

As indicated by the foregoing, for the example of FIG. 23, even when the high voltage V2 is applied, the volume of the depletion layer is reduced, resulting in a reduction of the leakage current. Whereas, the example of FIG. 23 can ensure the breakdown voltage equal to that of the example of FIG. 3. Incidentally, when the side p layer 14 and the side p layer 15 are depleted, the curvature of the depletion layer 22 at the side is relaxed. As a result, the concentration of an electric field can be avoided.

Whereas, with the method of manufacturing the example of FIG. 23, first, a step of forming the drift layer 12, and the side p layer 14 and the side p layer 15 is carried out. Secondly, a step of forming the base layer 31 is carried out. Thirdly, a step of forming a mesa structure is carried out.

Further, in the foregoing examples, the configuration of the basic unit of the drift layer and the low concentration layer serving as a base was described. However, even when a plurality of the basic units are connected in parallel to one another to be formed in a multi-cell device, the same functions and effects can be obtained. In other words, even when the invention is applied to a superjunction structure, the same functions and effects can be obtained.

Alternatively, other than the foregoing examples, even when an oxide film layer having minus electric charges is formed in place of the side p layer 14 and the side p layer 15 in the example of FIG. 23, the equal functions and effects may be obtained. In this case, a $p^-$ type low concentration layer is generated in the vicinity of the interference between the drift layer 12 and the oxide film layer, resulting in the substantially equal configuration as the configuration of the example of FIG. 23. The details thereof were described above, and hence are omitted.

Figure 25:
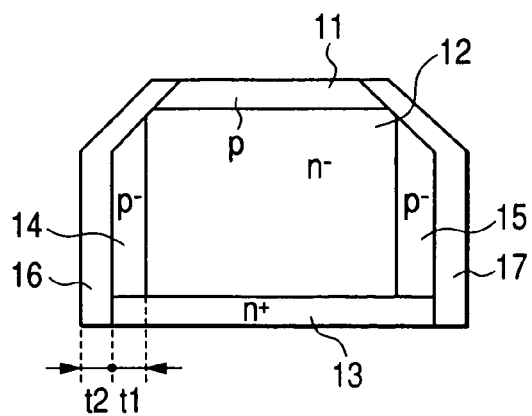
FIG. 25 is a longitudinal cross sectional diagram showing a basic unit of a diode part in another example of the invention.

Below, the invention will be described in detail by reference to FIG. 25. FIG. 25 is a longitudinal cross sectional diagram showing the basic unit of each diode part in other examples of the invention. The same elements as those in the example of FIG. 23 are given the same reference numerals and signs, and the description thereon is omitted.

A feature of the example of FIG. 25 resides in that an oxide film 16 and an oxide film 17 which are each an insulating material are included.

Particularly, the case where a semiconductor device of only a basic unit of the drift layer 12 and low concentration layers (a side p layer 14 and a side p layer 15) (which is not a multi-cell type) is formed will be described in details.

The concentration of the drift layer 12 is set based on the breakdown voltage of the device and the ON resistance of the device. Whereas, the amount of electric charges contained in the oxide film 16 and the oxide film 17 with a thickness t2 is set based on the process.

Then, the concentration and the thickness t1 of the side p layer 14 and the side p layer 15 are set based on the concentration of the drift layer 12, and the amount of electric charges contained in the oxide film 16 and the oxide film 17. Further, the mesa structure of the top of the side is also set based on the concentration of the drift layer 12, and the amount of electric charges contained in the oxide film 16 and the oxide film 17.

Thus, the depletion at a reverse bias is controlled. Then, the side p layer 14 and the side p layer 15 are depleted at a higher voltage than a predetermined reverse bias.

Further, with the method of manufacturing the example of FIG. 25, first, a step of forming the drift layer 12, and the side p layer 14 and the side p layer 15 is carried out. Secondly, a step of forming the base layer 31 is carried out. Thirdly, a step of forming a mesa structure is carried out. Fourthly, a step of forming the oxide film 16 and the oxide film 17 is carried out.

Such an example of FIG. 25 becomes equal to the example of FIG. 23, and produces the same functions and effects.

Whereas, the oxide film 16 and the oxide film 17 protect the side p layer 14 and the side p layer 15, respectively, to stabilize the characteristics.

Figure 26:
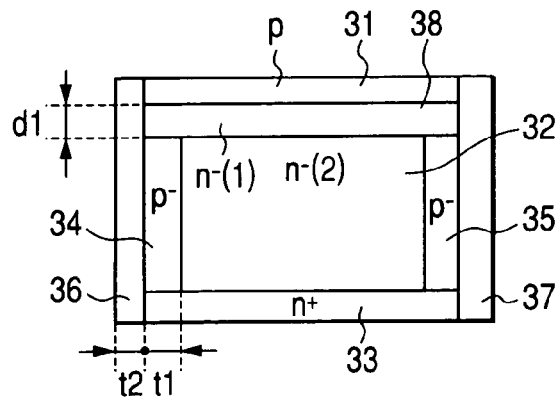
FIG. 26 is a longitudinal cross sectional diagram showing a basic unit of a diode part in a still other example of the invention.

Below, the invention will be described in details by reference to FIG. 26. FIG. 26 is a longitudinal cross sectional diagram showing the basic unit of each diode part in other examples of the invention. The base layer 11, the drift layer 12, the $n^+$ layer 33, the side p layer 34, and the side p layer 35, the oxide film 36, and the oxide film 37 of the example of FIG. 26 correspond to the base layer 11, the drift layer 12, the $n^+$ layer 13, the side p layer 14, and the side p layer 15, the oxide film 16, and the oxide film 17 of the example of FIG. 23, respectively.

A feature of the example of FIG. 26 resides in the configuration of a sub-drift layer 38.

The sub-drift layer 38 is formed between the base layer 31, and the side p layer 34 and the side p layer 35. Whereas, the sub-drift layer 38 is formed to be of the same polarity as that of the drift layer 32, and formed to be of an $n^-$ type.

Further, the concentration and the thickness d1 of the sub-drift layer 38 are set based on the concentration of the drift layer 32, and the amount of electric charges contained in the oxide film 16 and the oxide film 17.

As for such an example of FIG. 26, as with the example of FIG. 23, when the low voltage V1 is applied, the volume of the depletion layer is reduced. Therefore, for the example of FIG. 26, the leakage current can be reduced as with the example of FIG. 23. Then, the sub-drift layer 38 controls the depletion at a reverse bias.

Similarly, also when drift layers are formed in multistage layers, the leakage current can be reduced. Further, also when the concentration of the drift layer is gradually changed, the same functions and effects are produced. As a result, the leakage current can be reduced.

Whereas, with the method of manufacturing the example of FIG. 26, first, a step of forming the drift layer 32, and the side p layer 34 and the side p layer 35 is carried out. Secondly, a step of forming the sub-drift layer 38 is carried out. Thirdly, a step of forming the base layer 31 is carried out. Fourthly, a step of forming the oxide film 36 and the oxide film 37 is carried out.

Whereas, in the foregoing examples, the configuration of only the diode part serving as a base was described. However, it is possible to obtain the same functions and effects also for a MOSFET or IGBT, or other semiconductor devices each having this configuration.

As described above, the invention is not limited to the foregoing examples, and include still more variations and modifications within the scope not departing from the gist thereof.

As apparent from the foregoing description, in accordance with the invention, the following effects are produced.

In accordance with the invention, it is possible to provide a semiconductor device having a small leakage current, and a method of manufacturing the semiconductor device. More particularly, in accordance with the invention, it is possible to provide a high breakdown voltage semiconductor device having a small leakage current at a low voltage, and a method of manufacturing the semiconductor device.

What is claimed is:

1. A semiconductor device comprising:
   a substrate;
   a first electrode and a second electrode formed on the substrate;
   a single drift layer which is formed between the first electrode and the second electrode, becomes conduction in an ON state, and becomes depletion in an OFF state;

three or more p base layers formed within said single drift layer;

two or more gate electrodes formed within said single drift layer, each said gate electrodes having an oxide film layer separating the gate electrode from the drift layer and one of the first electrode and the second electrode; and a low concentration layer which is formed outside the drift layer, is opposite in polarity to that of the drift layer, and becomes depletion in the OFF state.

2. The semiconductor device according to claim 1, wherein a width of a device of the semiconductor device is equal to or smaller than a width based on a concentration of the drift layer.

3. The semiconductor device according to claim 2,
wherein the low concentration layer has a concentration such that the entire drift layer and the entire low concentration layer become depletion in an OFF state at a lower voltage than a breakdown voltage of the device of the semiconductor device.

4. The semiconductor device according to claim 2, wherein said single drift layer has plural portions that are integrally formed and joined,
wherein the first electrode or the second electrode is shared in common for the plurality of the drift layers portions, and the majority of the plurality of the drift layer portions are formed in parallel.

5. The semiconductor device according to claim 4, wherein the drift layer is formed in a shape of a combination of U shapes.

6. The semiconductor device according to claim 4,
wherein the drift layer is formed in a continuous fanfold form.

7. The semiconductor device according to claim 4,
wherein a width of one drift layer portion at an intersection between the drift layer portions is narrower than a width of another drift layer portion.

8. The semiconductor device according to claim 4, further comprising:
a slit at each intersection between the drift layers portions.

9. The semiconductor device according to claim 4,
wherein intersections between the drift layer portions are formed in a staggered configuration.

10. The semiconductor device according to claim 1,
wherein the concentration of the low concentration layer is based on electric charge of an insulating material, a protective material or a sealing material outside the low concentration layer.

11. The semiconductor device according to claim 1,
wherein a width of a device of the semiconductor device is large so that a breakdown voltage of the device is determined by a concentration of the drift layer and a thickness of the drift layer.

12. The semiconductor device according to claim 11,
wherein the low concentration layer has a concentration such that the entire drift layer and the entire low concentration layer become depletion in a reverse bias state at a lower voltage than the breakdown voltage.

13. The semiconductor device according to claim 1,
wherein the low concentration layer is formed in a continuously meandering non-separated layout.

14. The semiconductor device according to claim 13,
wherein an isolation trench regarding the layout is backfilled with an insulating material, and is planarized.

15. The semiconductor device according to claim 1, further comprising:
an insulating material.

16. The semiconductor device according to claim 1, further comprising:
indicia of dicing on at least a side surface thereof.

17. A semiconductor device, comprising:
a substrate;
a first electrode and a second electrode formed on the substrate;
a single p type drift layer which is formed between the first electrode and the second electrode, and becomes conduction in an ON state, and becomes depletion in an OFF state;
three or more p base layers formed within said single p type drift layer;
two or more gate electrodes formed within said single p type drift layer, each said gate electrodes having an oxide film layer separating the gate electrode from the p type drift layer and one of the first electrode and the second electrode; and
an insulating material which is formed on a side of the p type drift layer and has a predetermined fixed electric charge.

18. A semiconductor device comprising:
a substrate;
a first electrode and a second electrode formed on the substrate;
a single drift layer which is formed between the first electrode and the second electrode, becomes conduction in an ON state, and becomes depletion in an OFF state;
three or more p base layers formed within said single drift layer;
two or more gate electrodes formed within said single drift layer, each said gate electrodes having an oxide film layer separating the gate electrode from the drift layer and one of the first electrode and the second electrode; and
a low concentration layer which is formed on a side of the drift layer, and is opposite in polarity to that of the drift layer,
wherein the low concentration layer is configured to float from a base layer connected to the first electrode,
wherein the base layer is substantially orthogonal to the low concentration layer, and
wherein the base layer is in contact with the single drift layer.

19. The semiconductor device according to claim 18,
wherein a distance between the low concentration layer and the base layer is based on a thickness of a depletion layer generated at a predetermined reverse bias.

20. The semiconductor device according to claim 19, further comprising:
a sub-drift layer which is formed between the base layer and the low concentration layer, is same in polarity with that of the drift layer, and controls the depletion at the reverse bias.

21. The semiconductor device according to claim 18,
wherein the low concentration layer becomes depletion at a higher voltage than a predetermined reverse bias.

22. The semiconductor device according to claim 18,
wherein a region between the low concentration layer and the base layer is formed in a mesa structure.

23. The semiconductor device according to claim 22,
formed to be a multicell device including the drift layer and the low concentration layer as a basic unit.

* * * * *